(12) United States Patent
Kang et al.

(10) Patent No.: US 7,295,482 B2
(45) Date of Patent: Nov. 13, 2007

(54) SEMICONDUCTOR MEMORY DEVICE FOR A LOW VOLTAGE OPERATION

(75) Inventors: Hee-Bok Kang, Ichon-shi (KR); Jin-Hong Ahn, Ichon-shi (KR)

(73) Assignee: Hynix Semiconductor Inc., Kyoungki-do (KR)

(*) Notice: Subject to any disclaimer, the term of this patent is extended or adjusted under 35 U.S.C. 154(b) by 15 days.

(21) Appl. No.: 11/185,738

(22) Filed: Jul. 21, 2005

(65) Prior Publication Data

US 2006/0221664 A1    Oct. 5, 2006

(30) Foreign Application Priority Data

Mar. 31, 2005    (KR)    ............ 10-2005-0027383

(51) Int. Cl.
*G11C 7/00*    (2006.01)

(52) U.S. Cl. ............ 365/203; 365/230.03; 365/210

(58) Field of Classification Search ............ 365/203, 365/210, 230.03
See application file for complete search history.

(56) References Cited

U.S. PATENT DOCUMENTS

| | | | |
|---|---|---|---|
| 5,235,550 A | 8/1993 | Zagar | |
| 6,078,538 A | 6/2000 | Ma et al. | |
| 6,370,072 B1* | 4/2002 | Dennard et al. | ............ 356/210 |
| 6,538,942 B2* | 3/2003 | Ferrant | ............ 365/203 |
| 6,678,199 B1 | 1/2004 | Joo | |

FOREIGN PATENT DOCUMENTS

| | | |
|---|---|---|
| JP | 10-340581 | 12/1998 |
| JP | 2005-051044 | 2/2005 |
| KR | 1998-067036 | 10/1998 |
| KR | 10-2004-0065322 A | 7/2004 |
| KR | 2004 65322 | 7/2004 |

* cited by examiner

*Primary Examiner*—David Lam
(74) *Attorney, Agent, or Firm*—Finnegan, Henderson, Farabow, Garrett & Dunner, L.L.P.

(57) ABSTRACT

A semiconductor memory includes first and second cell arrays for applying a data signal onto pairs of first bit lines and second bit lines, respectively, first and second reference cell blocks each of which applies a reference signal onto a corresponding bit line bar or a corresponding bit line when the data signal is inputted to the corresponding bit line or the corresponding bit line bar, and a sense amp for sensing and amplifying a difference of data signals applied onto one pair of bit lines connected thereto of the pairs of first and second bit lines, wherein each bit line maintains a floating state without an input of an extra pre-charge voltage upon a pre-charge operation, and the other pair of bit lines disconnected to the sense amp are pre-charged with the reference signal by the corresponding reference cell block.

35 Claims, 11 Drawing Sheets

SEMICONDUCTOR MEMORY DEVICE FOR A LOW VOLTAGE OPERATION

FIELD OF THE INVENTION

The present invention relates to a semiconductor memory device; and, more particularly, to a semiconductor memory device that is capable of operating efficiently when a supply voltage to the device is low.

BACKGROUND OF THE INVENTION

FIG. 1 shows a block diagram illustrating a configuration of a conventional semiconductor memory device.

Referring to FIG. 1, the conventional semiconductor memory device comprises a row address input unit 20 for inputting and decoding a row address to output decoded data, a column address input unit 30 for inputting and decoding a column address to provide decoded data, a cell region unit 100 having plural cell arrays 110 to 140 with unit cells for outputting the data from the row address input unit 20 and the column address input unit 30, and a data input/output (I/O) unit 40 for transferring the data from the cell region unit 100 to the outside, or delivering data from the outside to the cell region unit 100.

The cell region unit 100 includes sense amp units 150 and 160 for amplifying the data signals from the cell arrays 110 to 140 and providing amplified signals to the data I/O unit 40. Further, each of the cell arrays 110 to 140 in the cell region unit 100 contains a plurality of unit cells.

Each sense amp functions to sense and amplify the data signals applied to the cell arrays 110 to 140 to output amplified signals to the data I/O unit 40, upon a read operation by the semiconductor memory device as mentioned above, while it serves to latch data from the data I/O unit 40 and transfer it to each cell array, upon a write operation by the device.

FIG. 2 depicts a detailed circuit diagram of the general semiconductor memory device, especially the cell array.

As shown in FIG. 2, the cell array of the semiconductor memory device is provided with plural word lines WL0, WL1, WL2, . . . , and plural bit lines BL, /BL, . . . , which intersect each other, wherein there is prepared one unit cell per an intersection point.

Each unit cell, e.g., CELL1, includes a MOS transistor M0 for conducting switch function and a capacitor C0 for storing data. The MOS transistor M0 constituting the unit cell is configured such that its gate is connected to the word line WL0, and one port to the bit line BL and the other port to the capacitor C0. And, the capacitor C0 is structured such that its one port is coupled with the other port of the MOS transistor M0, which inputs a plate voltage PL.

A pair of two unit cells CELL1 and CELL2 coupled with adjacent word lines WL0 and WL1 are commonly connected to one bit line BL and the two bit lines BL and /BL are coupled with a sense amp 152a of the sense amp unit 150 provided on one side of the cell array.

Specifically, upon a read of data on the unit cell CELL1, the word line WL0 is chosen and activated; and, thus, the MOS transistor M0 in the unit cell CELL1 is turned on and then data stored in the capacitor C0 is provided onto the bit line BL.

The bit line sense amp 152a senses and amplifies a difference of voltage levels between the bit line BL onto which data signal is applied and the bit line bar /BL onto which the data signal is not supplied.

After completing the amplification operation by the bit line sense amp 152a, the sensed and amplified data signal latched on the bit line BL is outputted to the external via external data bit lines LDB and LDBB.

At this time, the data signal is laid on the bit line BL, but its relative data is also amplified and latched on the bit line bar /BL, to provide it together with the data signal on the bit line BL in couples upon its transfer to the external of the cell array.

For example, if data "1" (indicating a state that electric charge is filled up) is stored in the capacitor C0 of the unit cell CELL1, a voltage on the bit line BL is amplified to a supply voltage level and a voltage on the bit line bar /BL is amplified to the ground voltage level. Further, if data "0" (implying a state that electric charge is discharged) is stored in the capacitor C0 of the unit cell CELL1, the voltage on the bit line BL is amplified to the ground voltage level and the voltage on the bit line bar /BL is amplified to the supply voltage level.

At this time, since an amount of the electric charge stored to indicate the data in the unit cell is very small, after using it in increasing the voltage on the bit line, the capacitor in the unit cell comes back to a state just before the discharge and then a recharging operation must be conducted in order to maintain the previous data in the capacitor continuously. Herein, the recharging operation stands for an operation to transfer the data signal latched on the sense amp to the capacitor in the unit cell and the word line is inactivated when the recharging operation has been completed.

In the meantime, upon a read of data on unit cell CELL3, the word line WL2 is activated; and, thus, the MOS transistor M2 in the unit cell CELL3 is turned on and then data stored in the capacitor C2 is applied to the bit line bar /BL. The sense amp 152a senses and amplifies a difference of voltage levels on the bit line bar /BL and the bit line BL. After the amplification operation by the sense amp 152a, the sensed and amplified data signal is outputted to the external via the external data lines LDB and LDBB. At this time, the data signal is applied to the bit line bar /BL, while a data signal with its complement level is provided to the bit line BL.

Meanwhile, in case of writing data in unit cell, a word line corresponding to the selected unit cell is activated and then data in that unit cell is sensed and amplified, as in the read operation above. After that, the sensed, amplified and latched data by the bit line sense amp 152a is replaced with data to be transferred and written from the outside.

The replaced data is latched by the bit line sense amp 152a and then the latched data is stored in the capacitor of the unit cell. If the data storage operation has been completed in the capacitor of the selected unit cell, then the word line becomes inactivated.

FIG. 3 is a configuration diagram showing a connection relationship between the sense amp and the cell array according to the prior art, particularly showing a shared bit line sense amp structure.

Referring to FIG. 3, the cell region unit 100 is provided with a multiplicity of cell arrays 100, 130 and 180 having unit cells wherein there are provided sense amp units 150 and 170 with sense amps for amplifying data between the cell arrays.

The sense amp unit 150 includes a plurality of sense amps, which correspond to the number of trine pairs coupled with one cell array.

In the shared bit line sense amp structure, since two cell arrays share one sense amp in order to decrease an area of circuit, one sense amp is sufficient for the pair of two bit lines.

Also, in case of the shared bit line sense amp structure, it is provided one sense amp unit 150 per the two cell arrays 110 and 130, in which the sense amp unit 150 and the cell arrays 110 and 130 are coupled or separated properly, based on connection signals BISH and BISL.

For instance, if a first connection signal BISH is activated, then a first connector 151 is enabled and the sense amp unit 150 is coupled with a cell array 0 110; and if a second connection signal BISL is activated, then a second connector 153 is enabled and the sense amp unit 150 is connected to a cell array 1 130.

In addition to the above connectors and the sense amps, the sense amp unit 150 further includes a pre-charge unit, a data output unit, etc., which are illustrated in FIG. 4.

FIG. 4 is a circuit diagram illustrating one embodiment of the sense amp unit shown in FIG. 2.

Referring to FIG. 4, the sense amp unit 150 comprises a sense amp 152a that is operative in response to sense amp power supply signals SAP and SAN for amplifying a difference of signals on the pair of bit lines BL and /BL, a pre-charge unit 155a that is enabled by a pre-charge signal BLEQ being provided when the sense amp 152a is not operated for pre-charging the pair of bits lines with a bit line pre-charge voltage VBLP, a first equalization unit 154a for equalizing voltage levels on the two bit lines BL and /BL connected to the cell array 0 110 in response to the pre-charge signal BLEQ, a second equalization unit 157a for equalizing voltage levels on the pair of bit lines BL and /BL connected to the cell array 1 130 in response to the pre-charge signal BLEQ, and a data output unit 156a for outputting the amplified data signal by the sense amp 152a to the outside through the data lines LDB and LDBB, in response to a column control signal YI being produced by a column address.

Further, as stated above, the sense amp unit 150 includes the first and second connectors 151a and 153a for connecting or disconnecting the sense amp 155a to or from the cell array 0 110 or the cell array 1 130.

FIG. 5 is a waveform diagram showing the operation of the conventional semiconductor memory device.

In succession, the operation of the conventional semiconductor memory device will be explained in detail with reference to FIGS. 1 to 4 below.

The semiconductor memory device is operated at intervals of pre-charge, read instruction, sense, and restore separately, upon a data read.

Further, operation and whole composition of data write process are also the same as those of the data read process except that there is a write instruction interval instead of the read instruction interval and data from the outside is latched by the sense amp in lieu of the output of data to the outside. Hereinafter, the operation of the data read will be described in detail.

First of all, in the following explanation, it is assumed that an electric charge is filled up in the capacitor. Also, it is assumed that upon a data read, the first connector 151a is enabled and the second connector 153a is disabled; and thus, the sense amp unit 150 is coupled with the first cell array 0 110.

During the pre-charge interval (Pre-charge), it is under the state that the pre-charge voltage is applied to the pair of two bit lines and that all the word lines are inactivated. A half of core voltage Vcore/2 is generally used as the pre-charge voltage (Vcore/2=VBLP).

At this interval, the pre-charge signal BLEQ is enabled at high level, and the first and the second equalization units 154a and 157a and the pre-charge unit 155a are enabled, thus making voltage levels on the pair of two bit lines maintained at Vcore/2. At this time, the first and the second connectors 151a and 153a are under the enable state.

In FIG. 5, a waveform SN indicates a voltage level applied to the capacitor in the unit cell, which represents the core voltage Vcore level because it is assumed that the data "1" is stored.

Next, at the read instruction interval (Read) where the read instruction is inputted and running, the first connector 151a maintains the enable state and the second connector 153a is in disable state. Thus, the sense amp unit 150 is connected to the cell array 0 110 arranged on its one side, while separating from the cell array 1 130 provided on its other side.

The word line WL is activated by high-voltage and is maintained up to the restore interval (Restore). At this time, the reason of applying a high voltage Vpp higher than the supply voltage onto the word line WL is to reduce loss that occurs by means of transferring the data "1" stored in the capacitor by a threshold voltage of NMOS transistor forming the unit cell onto the bit line.

In the semiconductor memory device, it is required that the supply voltage is low while the operation speed is to be more rapid. By generating the high voltage Vpp higher than the core voltage Vcore supplied to a cell region of the semiconductor memory device and using it in activating the word line WL, the word line WL can be activated at high speed.

If the word line WL is activated, the MOS transistor of the corresponding unit cell is turned on and thus the data stored in the capacitor is applied to the bit line BL.

Accordingly, the voltage on the bit line BL pre-charged with the half of core voltage Vcore/2 ascends a bit. At this time, even though the capacitor is charged with the core voltage level, the voltage on the bit line BL does not rise up to the core voltage but rises by a certain voltage $\Delta V$ from Vcore/2 since a capacitance Cc of the capacitor in the unit cell is very small compared to a parasitic capacitance Cb on the bit line BL.

As can be seen from FIG. 5, the voltage levels applied to the unit cell capacitor and onto the bit line BL ascend by the constant voltage $\Delta V$ from Vcore/2 at the read instruction interval (Read).

Meanwhile, since no further electric charge is supplied onto the bit line BL, the half of core voltage Vcore/2 is maintained.

Thereafter, during the sense interval (Sense), the first and the second driving voltages SAP and SAN, which are maintained at Vcore/2 during the pre-charge interval (Precharge), are supplied to the bit line sense amp 152a as the core voltage and the ground voltage, respectively. According to this, the bit line sense amp 152a senses a difference of voltages on the two bit lines BL and /BL and amplifies the differential voltage wherein it amplifies the relatively high voltage to the core voltage Vcore and the relatively low voltage to the ground voltage.

Herein, since the voltage level on the bit line BL is mainlined to be higher than that on the bit line bar /BL, the voltage on the bit line BL is replaced with the core voltage Vcore and the voltage on the bit line bar /BL with the ground voltage upon a completion of the sensing and amplifying operation.

At the following restore interval (Restore), the recharging operation is carried out since there is a discharge of the electric charge for data stored in the capacitor of the unit cell to ascend the voltage level on the bit line BL from Vcore/2 at the read interval (Read). If the recharging operation has been completed, the word line is again inactivated.

Next, referring again to the pre-charge interval, the first and the second drive voltages SAP and SAN being supplied to the sense amp are maintained at Vcore/2 and the pre-charge signal BLEQ is activated and inputted. Based on this, the first and the second equalization units 154a and 157a and the pre-charge unit 155a are activated and the pre-charge voltage VBLP is supplied to the pair of bit lines BL and /BL. At this time, the first and the second connectors 151a and 153a are activated and the sense amp 150 is connected to all of the cell arrays 110 and 130 provided on its one side and other side.

As technology develops more and more, a level of the supply voltage for driving the semiconductor memory device becomes low gradually. But, although the magnitude of the supply voltage is low, it is required that the operation speed of the semiconductor memory device is maintained as before or is to be more high.

As mentioned above, the core voltage Vcore of level lower than the supply voltage and the high voltage higher than the core voltage Vcore are created internally and used properly in the existing semiconductor memory device.

Up to now, it is possible to guarantee the required operation speed only by improving process technology of the memory device further, without a use of any specific method, though the supply voltage is decreased properly.

For example, if a level of the supply voltage is decreased to 2.5V or less from 3.3V, the required operation speed can be met in the process of gradually decreasing to 100 nm from 500 nm in manufacturing process technology. In other words, improving the process technology results in a decrease in consumption power of transistor manufactured compared to before and also more rapid operation speed than before, upon a supply of the same voltage.

However, it is very difficult to decrease the process technology further as before, under 100 nm.

Furthermore, under the situation that the required supply voltage is low to 1.5V below 2.0V, so far as 1.0V, it is very hard to maintain the operation speed as before, by the decrease of the process technology merely.

Moreover, if the level of the supply voltage supplied to the memory device is lower than a fixed level, then an operation margin of MOS transistor constituting the memory device is very small, thus making it to be not operated at the required operation speed and also lowering the reliability of operation.

Basically, under the state that a turn-on voltage of MOS transistor is maintained at a constant level, if a level of the driving voltage to the memory device falls below the constant level, it takes much time to stably sense and amplify a difference of voltages applied onto the pair of two bit lines by the bit line sense amp.

At this time, even if a little noise occurs (in case bit line voltage level rises or falls due to a little noise in the ½ core voltage), there exists an instance where the sense amp does not sense it.

Thus, decreasing the driving voltage of the memory device below the constant level is very hard under the existing technology.

Further, if the manufacturing technology of the memory device is very improved, a space between the gate polarity of MOS transistor constituting each unit cell and its adjacent bit lines becomes very small, thus incurring a leakage current between the gate polarity and the bit lines. At this time, flowing leakage current is called bleed current.

FIG. 6 is a cross-sectional view showing the problems of the conventional semiconductor memory device, especially leakage current in a low-voltage high-integrated semiconductor memory device.

FIG. 6 shows a cross-sectional view of one unit cell in the semiconductor memory device, which comprises an element isolation film 11, a source/drain conjunction regions 12a and 12b, a gate polarity 13, a bit line 17, capacitors 14 to 16, and isolation films 18 and 19, prepared on a substrate 10.

Due to the decrease in the process technology of the semiconductor memory device, an interval A between the gate polarity 13 and the bit line 17 becomes narrow gradually, making sufficient isolation difficult.

Under such state, during the pre-charge interval, the ½ core voltage is applied onto the bit line, whereas the ground voltage is supplied to the gate polarity as the word line.

Because of errors in the process, there may be a short between the bit line and the gate polarity provided as the word line; and in this case, the bleed current as the leakage current continuously flows to the word line from the bit line during the pre-charge interval.

After manufacturing the memory device, repair process is conducted, which replaces erroneous cells with spare cells prepared in advance on a word line basis, not on a unit cell basis, by considering characteristics of the memory device.

That is to say, when there is found a defect in unit cells during the operation of the memory device, spare word lines are employed instead of the corresponding word lines.

If the defect is issued due to the short between the gate polarity as the word line and the bit line, the bleed current still flows to the word line from the bit line that is under the pre-charge state by the ½ core voltage although there exists no problem by replacing with the spare word lines.

As the technology develops, it is very important issue to operate the memory device at low power. But, as long as there occurs the bleed current, such semiconductor memory device may be not employed in a system, even under an absence of the operation problem.

To decrease the bleed current, there has been evolved an idea of adding a resistor to a path in which the bleed current flows. Such idea merely reduces the bleed current somewhat but does not present any fundamental solution.

Another problem is that there is leakage current between the bit line sense amp and cell arrays that are not connected thereto.

Specifically, when a cell array is connected to the bit line sense amp for operation, other cell arrays are separated from the bit line sense amp by making a turn off of NMOS transistor provided in the connector.

At this time, bit lines of the non-connected cell arrays are maintained at the pre-charge voltage (namely, VDD/2); and in the bit line sense amp one bit line carrying the data signal is maintained at the supply voltage and the other bit lines carrying no data signal are maintained at the ground voltage.

Thus, although the MOS transistor forming the connector is turned off, the leakage current flows to the bit line sense amp from non-selected cell arrays. This is the reason that makes the operation current increased upon an access of data. Sub_Vt Leak Current shown in FIG. 4 indicates such leakage current as described above.

SUMMARY OF THE INVENTION

It is, therefore, a primary object of the present invention to provide to a semiconductor memory device that is capable of maintaining a same operation speed, without a use of high voltage, even when a driving voltage is low (e.g., 1.0V or less). In particular, the present invention provides a semiconductor memory device capable of reducing a leakage current in a bit line sense amp unit at a low voltage.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
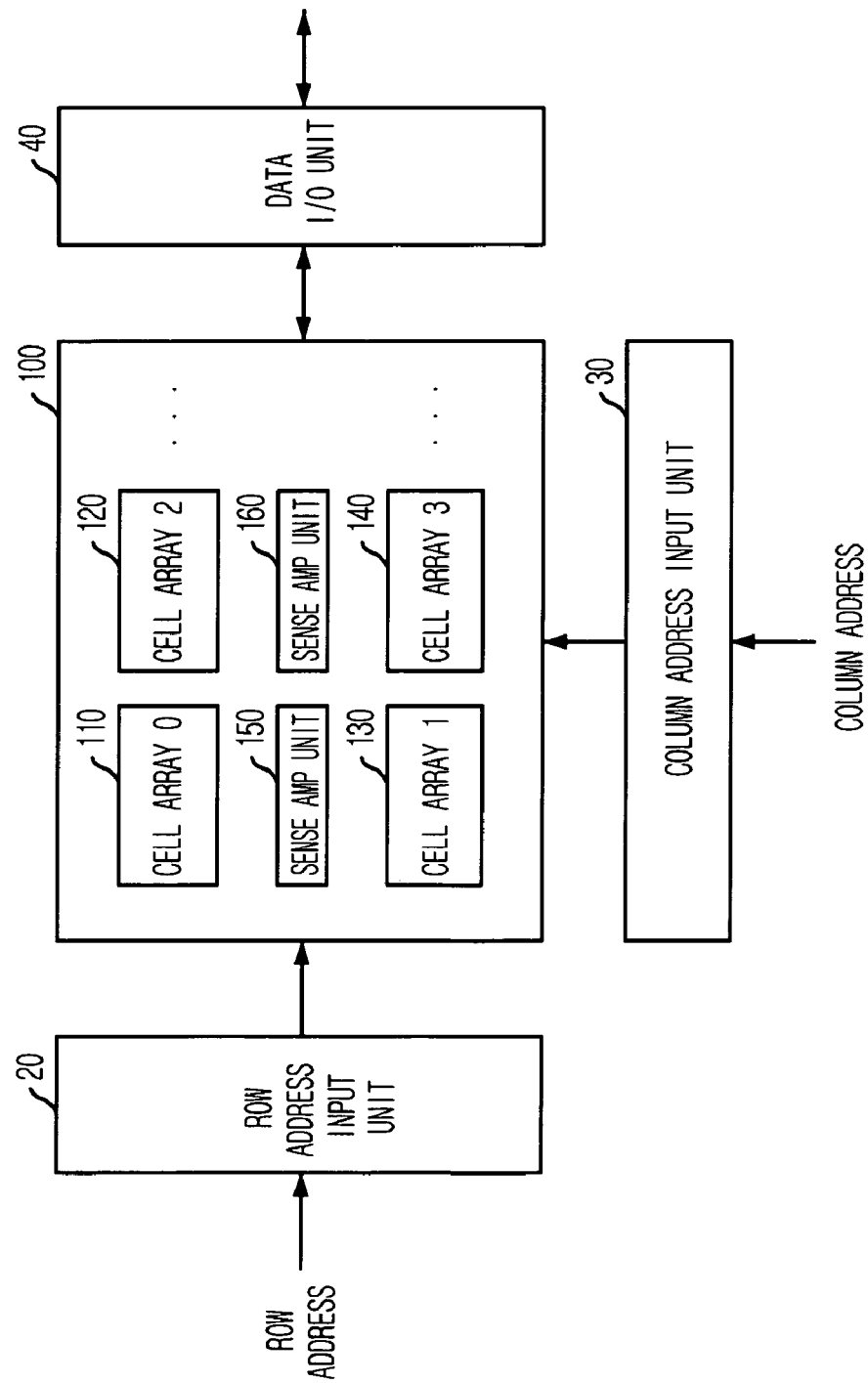
FIG. 1 shows a block diagram illustrating a structure of a conventional semiconductor memory device.
Figure 2:
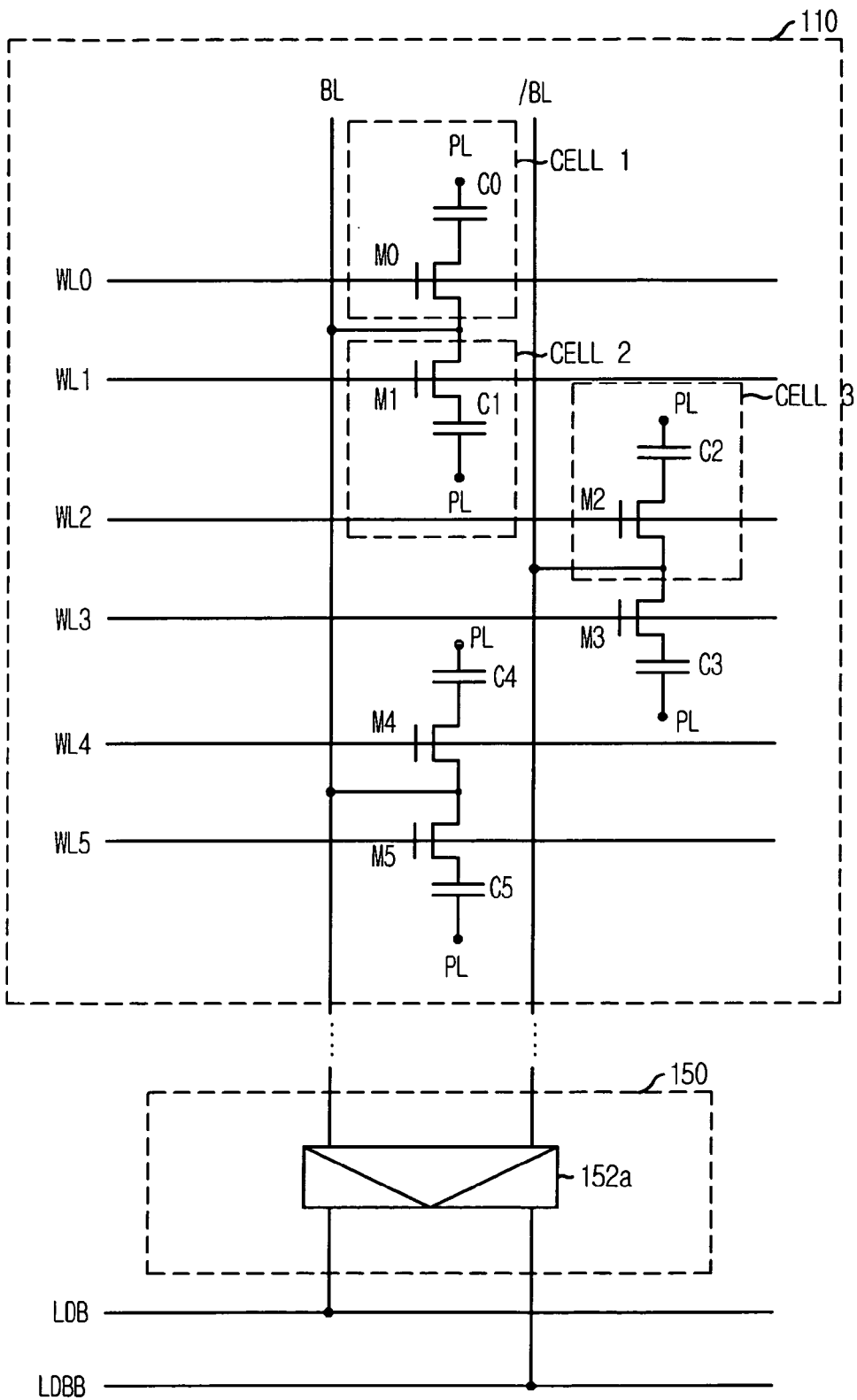
FIG. 2 is a circuit diagram of a cell array in the conventional semiconductor memory device.
Figure 3:
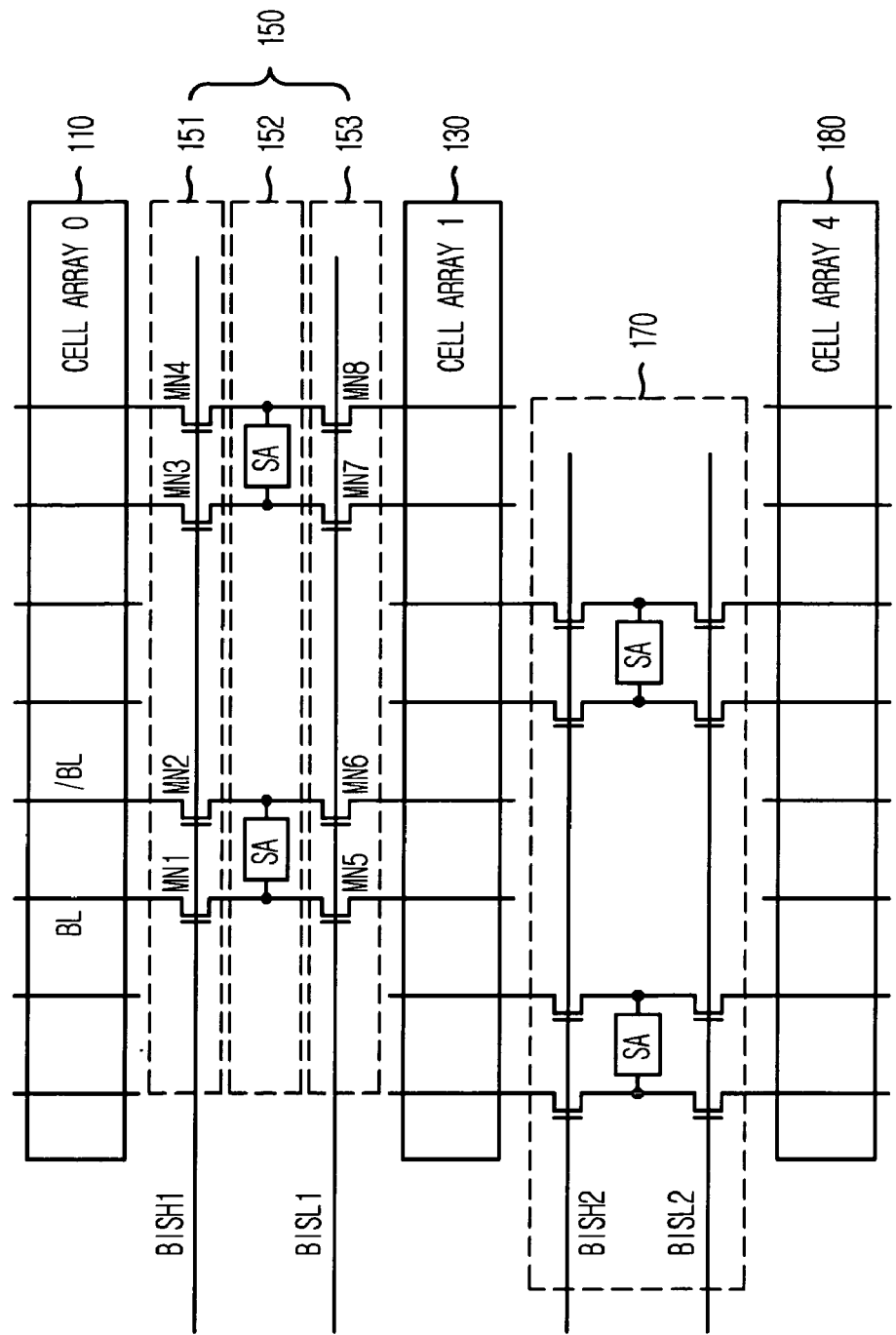
FIG. 3 is a configurative diagram showing a connection relationship between a sense amp and a cell array structure according to the prior art, in particular a structure of a shared bit line sense amp.
Figure 4:
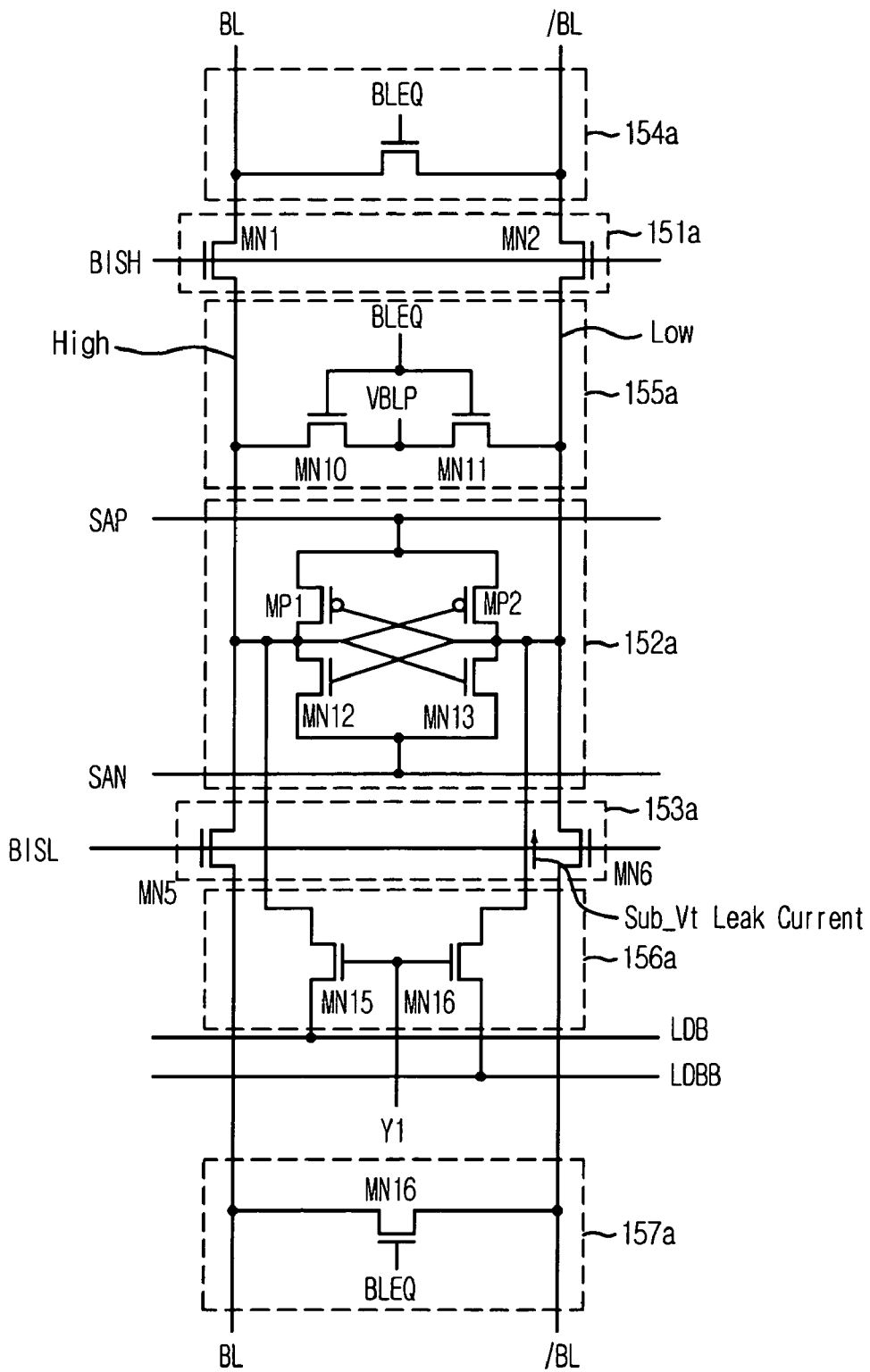
FIG. 4 presents a circuit diagram showing a structure of one embodiment of the sense amp unit shown in FIG. 2.
Figure 5:
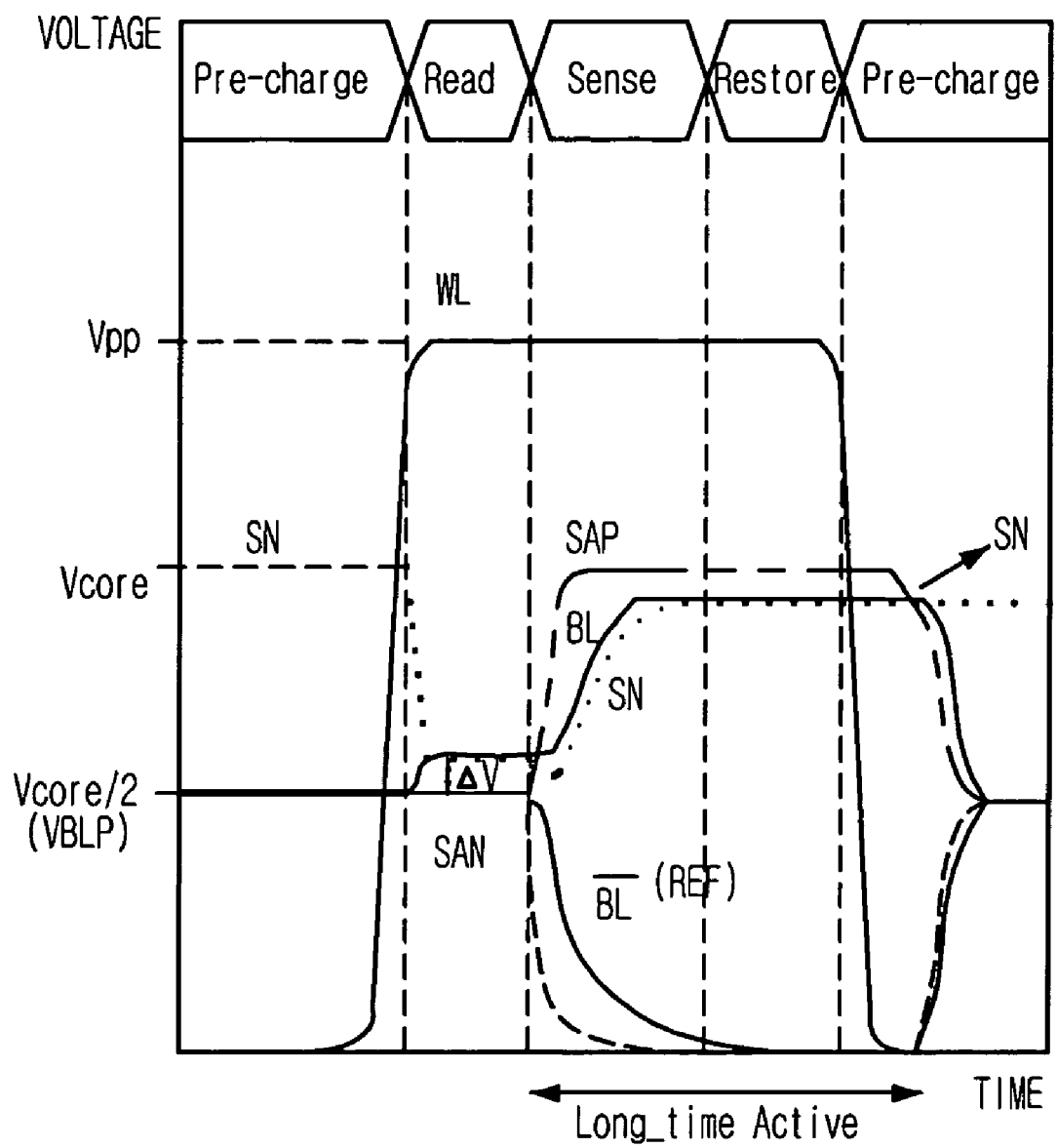
FIG. 5 is a waveform diagram representing the operation of the conventional semiconductor memory device.
Figure 6:
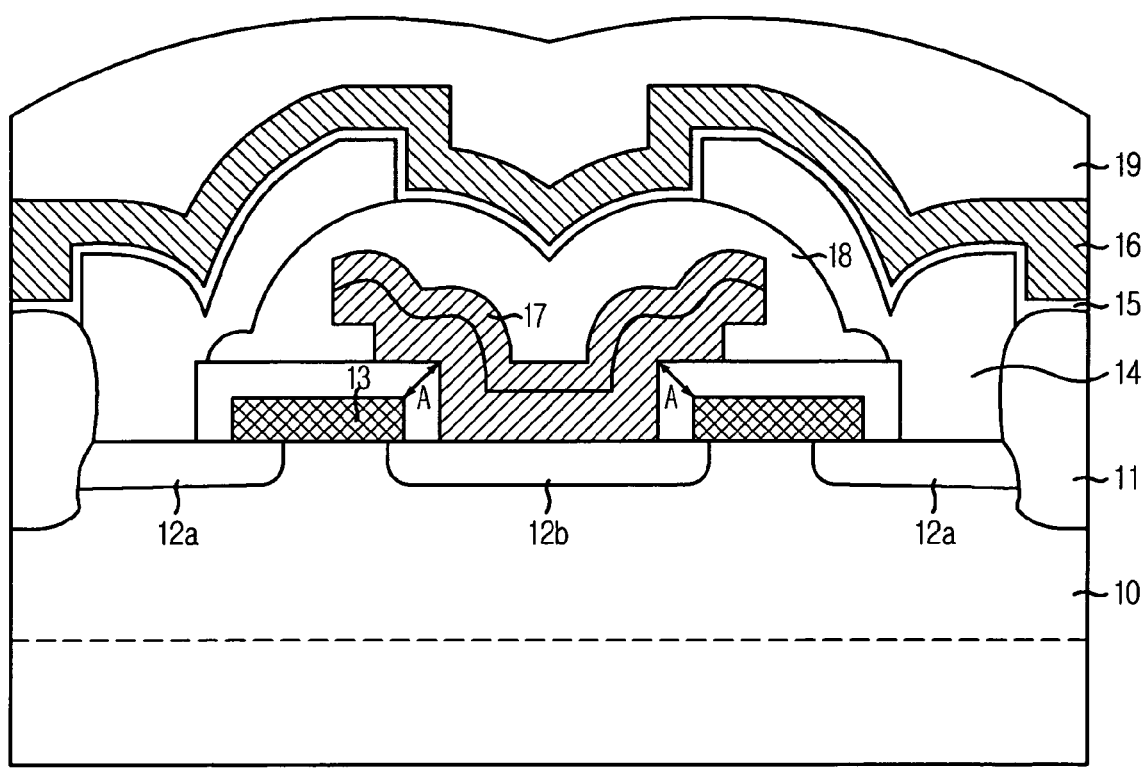
FIG. 6 is a cross-sectional diagram showing the problems of the conventional semiconductor memory device.

In accordance with one aspect of the present invention, there is provided a semiconductor memory device with a folded bit line structure, which is operative by an input of a supply voltage and a ground voltage, comprising: a first cell array for applying a data signal onto a first bit line or a first bit line bar; a first reference cell block for applying a reference signal onto the first bit line bar when the data signal is inputted onto the first bit line, or the reference signal onto the first bit line bar when the data signal is inputted onto the first bit line bar; a second cell array for applying the data signal onto a second bit line or a second bit line bar; a second reference cell block for applying the reference signal onto the second bit line bar when the data signal is inputted onto the second bit line, or the reference signal onto the second bit line bar when the data signal is inputted onto the second bit line bar; and a bit line sense amp for sensing and amplifying a difference of the data signals applied onto one pair of bit lines that are connected to the sense amp, out of a pair of the first bit lines or a pair of the second bit lines, wherein each bit line maintains a floating state without an input of a separate pre-charge voltage upon a pre-charge operation, and the other pair of the bit lines that are not connected to the sense amp are pre-charged with the reference signal by the corresponding reference cell block.

In accordance with another aspect of the present invention, there is provided a driving method for use in a semiconductor memory device having a folded bit line structure, which is operative by an input of a supply voltage and a ground voltage, of sensing and amplifying a difference of voltage levels of signals applied to a first bit line and a first bit line bar that are connected to a first cell array arranged on one side of a bit line sense amp, or to a second bit line and a second bit line bar that are connected to a second cell array provided on the other side of the bit line sense amp, the method comprising the steps of: connecting the fist bit line and the first bit line bar to the bit line sense amp and disconnecting the second bit line and the second bit line bar from the bit line sense amp; activating unit cell selected among a plurality of unit cells provided in the first cell array and transferring a data signal stored in the unit cell to the first bit line; applying a reference signal onto the first bit line bar; sensing, and amplifying, and latching a difference of data signals on the first bit line and the bit line bar using the ground voltage and a low voltage whose absolute value is lower than the ground voltage by the bit line sense amp; and maintaining voltage levels on the second bit line and the second bit line bar connected to the second cell array at a pre-charge level, during an interval where the first cell array is connected to the bit line sense amp.

Hereinafter, to explain the present invention in detail to the extent that a person skilled in the art could easily conceive the technical spirit of the invention under the technical field to which the invention belongs, most preferred embodiments of the present invention will be described in detail with reference to the accompanying drawings.

Figure 7:
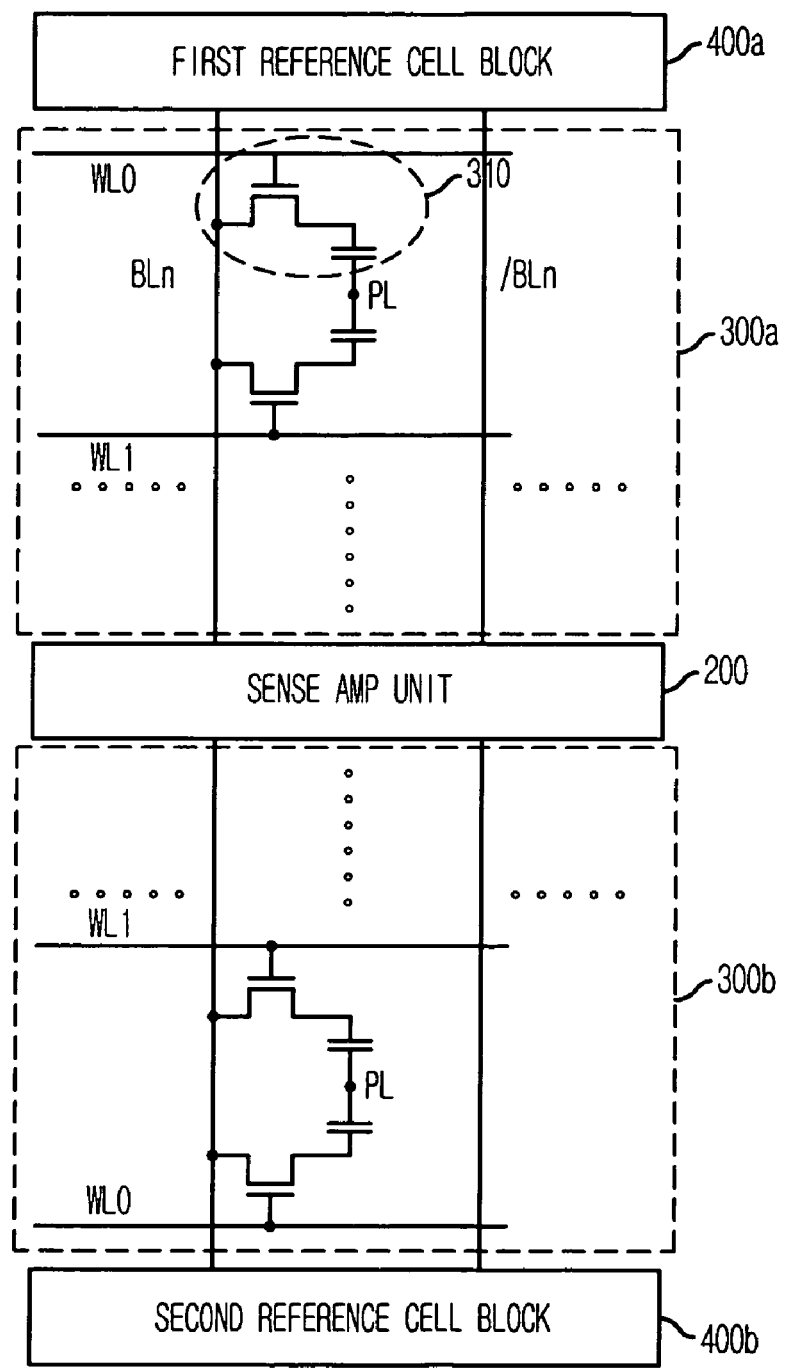
FIG. 7 depicts a logical circuit diagram illustrating a structure of a semiconductor memory device in accordance with a preferred embodiment of the present invention.

FIG. 7 depicts a logical circuit diagram illustrating a structure of a semiconductor memory device in accordance with a preferred embodiment of the present invention.

Referring to FIG. 7, the semiconductor memory device in accordance with this embodiment comprises a plurality of cell arrays 400a and 400b with unit cells, each unit cell, e.g., 310, consisting of an NMOS transistor and a capacitor.

In the memory device in accordance with this embodiment, adjacent two cell arrays 300a and 300b share a sense amp unit 200 for sensing and amplifying data signal applied to a bit line. For this, there is provided a connector for connecting each of the cell arrays 300a and 300b to the sense amp unit 200.

Further, in the memory device of this embodiment, the bit line maintains a floating state without an input of extra pre-charge voltage thereto at the pre-charge interval. For this, it comprises a first and a second reference cell blocks 400a and 400b for applying a reference signal onto a pair of the bit line and a bit line bar to precisely sense data signal applied thereto by a bit line sense amp in the bit line sense unit 200. Details of the connector and the reference cell blocks as mentioned above will be disclosed with reference to FIGS. 8 and 9 below.

Figure 8:
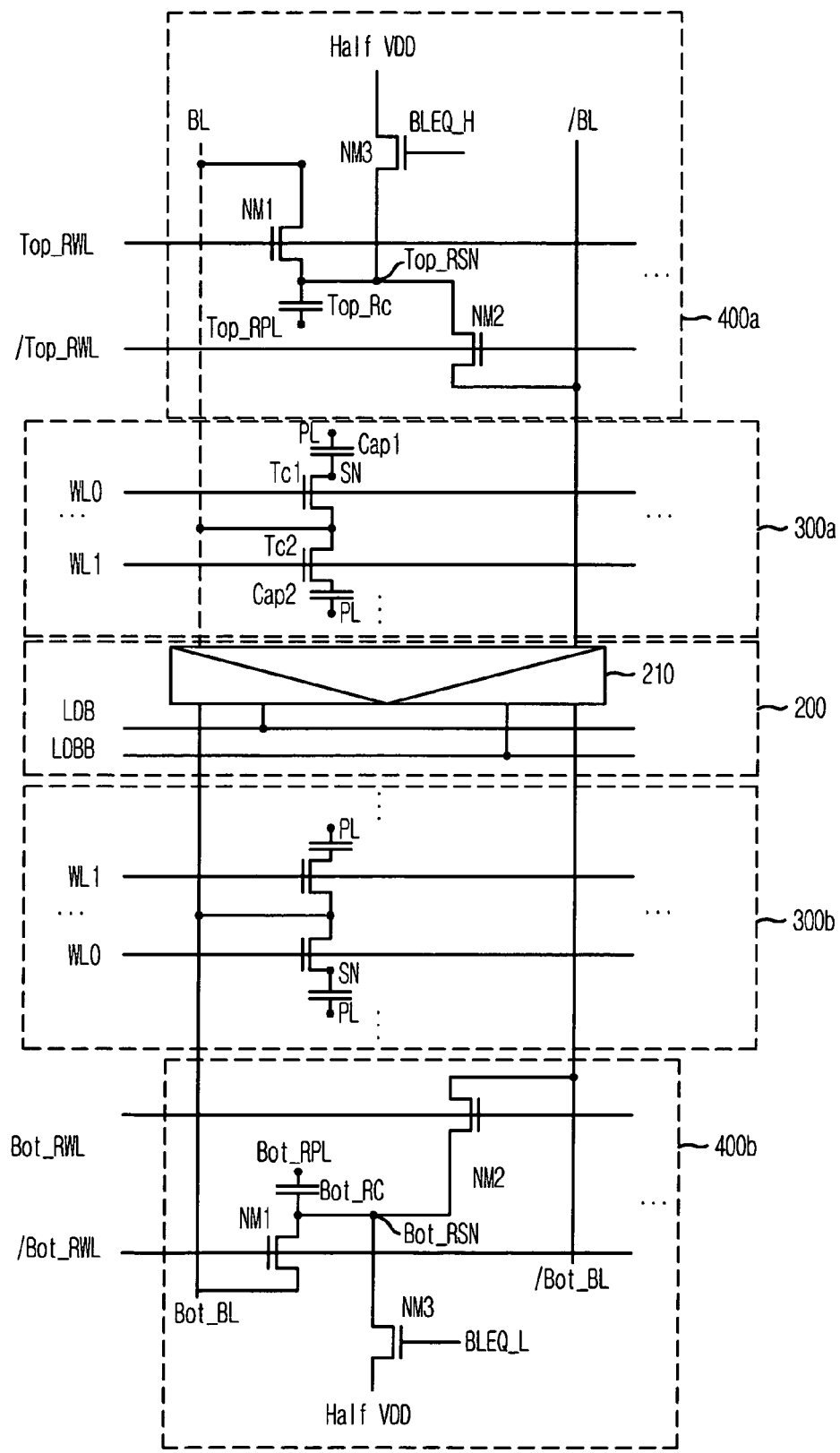
FIG. 8 is a logical circuit diagram showing the semiconductor memory device shown in FIG. 7, particularly a reference cell block in detail.
Figure 9:
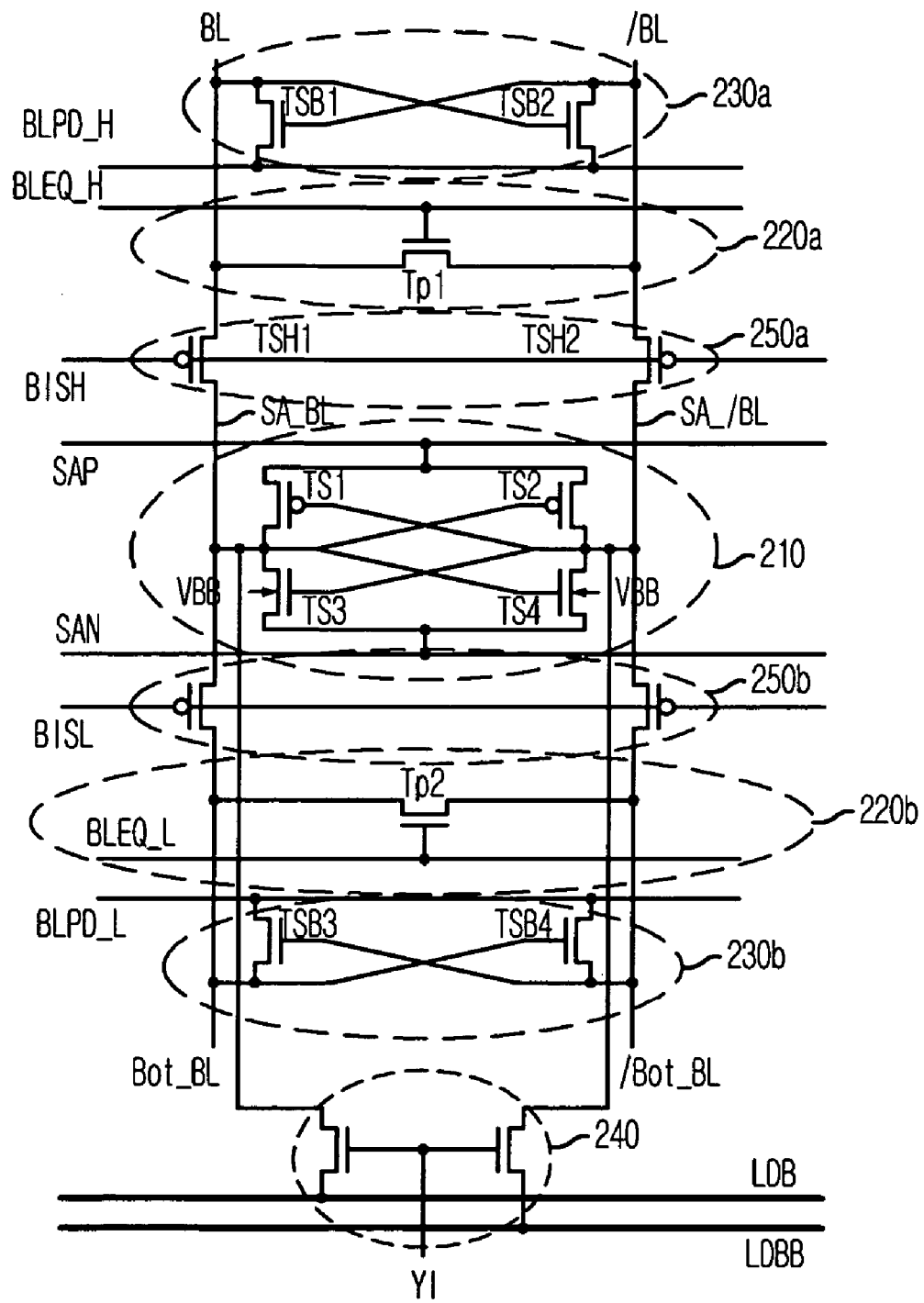
FIG. 9 is a logical circuit diagram showing the sense amp unit shown in FIG. 7.

FIG. 8 is a logical circuit diagram showing the semiconductor memory device shown in FIG. 7, particularly representing a reference cell block in detail, and FIG. 9 is a logical circuit diagram showing the sense amp unit shown in FIG. 7 in detail. The semiconductor memory device in accordance with this embodiment has a shared structure where it is of one bit line sense amp 210 per the adjacent two cell arrays while the cell arrays are of a folded structure.

Specifically, referring to FIGS. 8 and 9, the semiconductor memory device in accordance with this embodiment, which has a folded bit line structure and is operative in response to a supply voltage VDD and the ground voltage VSS, comprises a first cell array 300a that is provided with a plurality unit cells for applying data signal onto a first bit line BL or a first bit line bar /BL selected out of plural pairs of bit lines prepared to transfer each data signal stored in the unit cells, a second cell array 300b that is provided with a plurality unit cells for supplying data signal onto a second bit line Bot_BL or a second bit line bar /Bot_BL selected out of the pairs of bit lines to transfer each data signal stored in the unit cells, a first reference cell block 400a for applying a reference signal onto the first bit line bar /BL when the data signal is applied to the first bit line BL, or the reference signal onto the first bit line BL when the data signal is applied to the first bit line bar /BL, a second reference cell block 400b for applying the reference signal onto the second bit line bar /Bot_BL when the data signal is applied to the second bit line Bot_BL, or the reference signal onto the second bit line Bot_BL when the data signal is applied to the second bit line bar /Bot_BL, and a bit line sense amp 210 for sensing and amplifying a difference of signals applied to the pair of bit lines selected out of the pair of first bit lines or the pair of second bit lines, wherein, upon the pre-charge operation, each bit line is in a floating state without an input of separate pre-charge voltage, but the pair of bit lines that are not connected upon the sensing and amplifying operation by the bit line sense amp are pre-charged with the reference signal by the corresponding reference cell block.

In addition, the semiconductor memory device in accordance with the preferred embodiment of the present invention further comprises a first pre-charge unit 220a for equalizing voltage levels on the first bit line and the first bit line bar provided in the first cell array upon the pre-charge operation, and a second pre-charge unit 220b for equalizing voltage levels on the second bit line and the second bit line bar prepared in the second cell array upon the pre-charge operation.

The semiconductor memory device in accordance with the present embodiment further comprises a first connector 250a prepared between the bit line sense amp 210 and the first pre-charge unit 220a for connecting or separating each of the first bit line BL and the first bit line bar /BL to or from the bit line sense amp 210 arranged in the first cell array 300a, and a second connector 250b for connecting or separating each of the second bit line Bot_BL and the second bit line bar /Bot_BL to or from the bit line sense amp 210 provided in the second cell array 300b.

The first connector 250a includes a first PMOS transistor TBH1 for connecting the first bit line BL to the bit line sense amp 210 in response to a connection control signal BISH, and a second PMOS transistor TBH2 for connecting the first bit line bar /BL to the bit line sense amp 210 depending on the connection control signal BISH.

Further, the first pre-charge unit 220a includes an NMOS transistor TP1 for coupling the first bit line BL with the first bit line bar /BL at the pre-charge interval, and the second pre-charge unit 220b includes an NMOS transistor TP2 for coupling the second bit line Bot_BL with the second bit line bar /Bot_BL at the pre-charge interval.

The first reference cell block 400a includes a capacitor Top_RC for reference whose one port is coupled with a power supply port Top_RPL for a reference signal, a first PMOS transistor Top_NM1 for switch for connecting the other port of the capacitor Top_RC to the first bit line BL when the data signal is applied to the first bit line bar /BL, and a second PMOS transistor Top_NM2 for switch for connecting the other port of the capacitor Top_RC to the first bit line bar /BL when the data signal is applied to the first bit line BL.

Herein, it is characterized that a capacitance of the capacitor Top_RC for reference is substantially identical to that of the unit cell capacitor Cap1 prepared in the first cell array 400a.

Further, it is characterized that a voltage level supplied from the power supply port Top_RPL for reference signal is one of the ground voltage VSS, ½ of the supply voltage VDD, and the supply voltage VDD.

The number of the reference capacitors in the first reference cell block 400a is equal to that of the pairs of bit lines in the corresponding cell array 300a, wherein if there are 256 pairs of bit lines, 256 reference capacitors are provided in the first reference cell block 400a.

Each reference capacitor is connected to bit lines onto which the data signal is not applied out of the corresponding pairs of bit lines and provides a reference signal stored in the capacitor itself.

In addition, there is further provided a first auxiliary bit line sense amp 230a for amplifying and maintaining a line voltage with low level, out of voltages on the first bit line BL between the first cell array 300a and the first connector 250a and the first bit line bar /BL, to the ground voltage VSS level.

A signal BLEQ_H applied to the first auxiliary bit line sense amp 230a has the ground voltage level at an interval where the bit line sense amp is operated.

The first auxiliary bit line sense amp 230a includes a first MOS transistor TSB1 for auxiliary amp whose one port inputs a signal BLPD_H activated at an interval where the bit line sense amp 210 is activated, the other port is coupled with the first bit line BL prepared between the first cell array 300a and the first connector 250a, and gate is connected to the first bit line bar /BL between the first cell array 300a and the first connector 250a, and a second MOS transistor TSB2 for auxiliary amp whose one port inputs the signal BLPD_H activated at an interval where the bit line sense amp 210 is activated, the other port is coupled with the first bit line bar /BL prepared between the first cell array 300a and the first connector 250a, and gate is connected to the first bit line BL between the first cell array 300a and the first connector 250a.

Further, there is also provided a second auxiliary bit line sense amp 230b between the second cell array 300b and the bit line sense amp 210 for conducting the operation of amplifying and maintaining a line voltage with low level, out of voltage levels on the second bit line Bot_BL between the second cell array 300b and the second connector 250b and the second bit line bar /Bot_BL, to the ground voltage VSS level.

The second auxiliary bit line sense amp 230b includes a first NMOS transistor TSB3 for auxiliary amp whose one port inputs a signal BLPD_L activated at an interval where the bit line sense amp 210 is activated, the other port is coupled with the second bit line Bot_BL prepared between the second cell array 300b and the second connector 250b, and gate is connected to the second bit line bar /Bot_BL between the second cell array 300b and the second connector 250b, and a second NMOS transistor TSB4 for auxiliary amp whose one port inputs the signal BLPD_L activated at an interval where the bit line sense amp 210 is activated, the other port is coupled with the second bit line bar /Bot_BL prepared between the second cell array 300b and the second connector 250b, and gate is connected to the second bit line Bot_BL between the second cell array 300b and the second connector 250b.

The bit line sense amp 210 includes a first PMOS transistor TS1 for sense amp whose gate is connected to the first bit line bar /BL by the first connector 250a or to the second bit line bar /Bot_BL by the second connector 250b, one port inputs the supply voltage VDD, and the other port is connected to the first bit line BL by the first connector 250a or to the second bit line Bot_BL by the second connector 250b, a second PMOS transistor TS2 for sense amp whose gate is connected to the first bit line BL by the first connector 250a or to the second bit line bar /Bot_BL by the second connector 250b, one port inputs the supply voltage VDD, and the other port is connected to the first bit line bar /BL by the first connector 250a or to the second bit line bar /Bot_BL by the second connector 250b; a first NMOS transistor TS3 for sense amp whose gate is connected to the first bit line bar /BL by the first connector 250a or to the second bit line bar /Bot_BL by the second connector 250b, one port inputs a first low voltage VBB, and the other port is connected to the first bit line BL by the first connector 250a or to the second bit line Bot_BL by the second connector 250b, and a second NMOS transistor TS4 for sense amp whose gate is connected to the first bit line BL by the first connector 250a or to the second bit line Bot_BL by the second connector 250b, one port inputs the first low voltage VBB, and the other port is connected to the first bit line bar /BL by the first connector 250a or to the second bit line bar /Bot_BL by the second connector 250b. As set forth above, it is characterized that the bit line sense amp 210 performs the sensing and amplifying operation by using the supply voltage VDD and the first low voltage VBB (i.e., −0.5V) that is lower than the ground voltage VSS.

Further, the sense amp unit of the semiconductor memory device in accordance with this embodiment further includes a data input and output (I/O) unit 240 which transfers the sensed and amplified data by the bit line sense amp 210 to the outside via the data lines LDB and LDBB, or data from the outside through the data lines LDB and LDBB to the bit line sense amp 210.

The data I/O unit 240 includes a first I/O MOS transistor TO1 whose gate inputs an I/O control signal, on port is connected to the first and the second bit lines, and the other port is connected to the first data line LDB, and a second I/O MOS transistor TO2 whose gate inputs the I/O control signal, on port is connected to the first and the second bit lines, and the other port is connected to the second data line LDBB.

Figure 10:
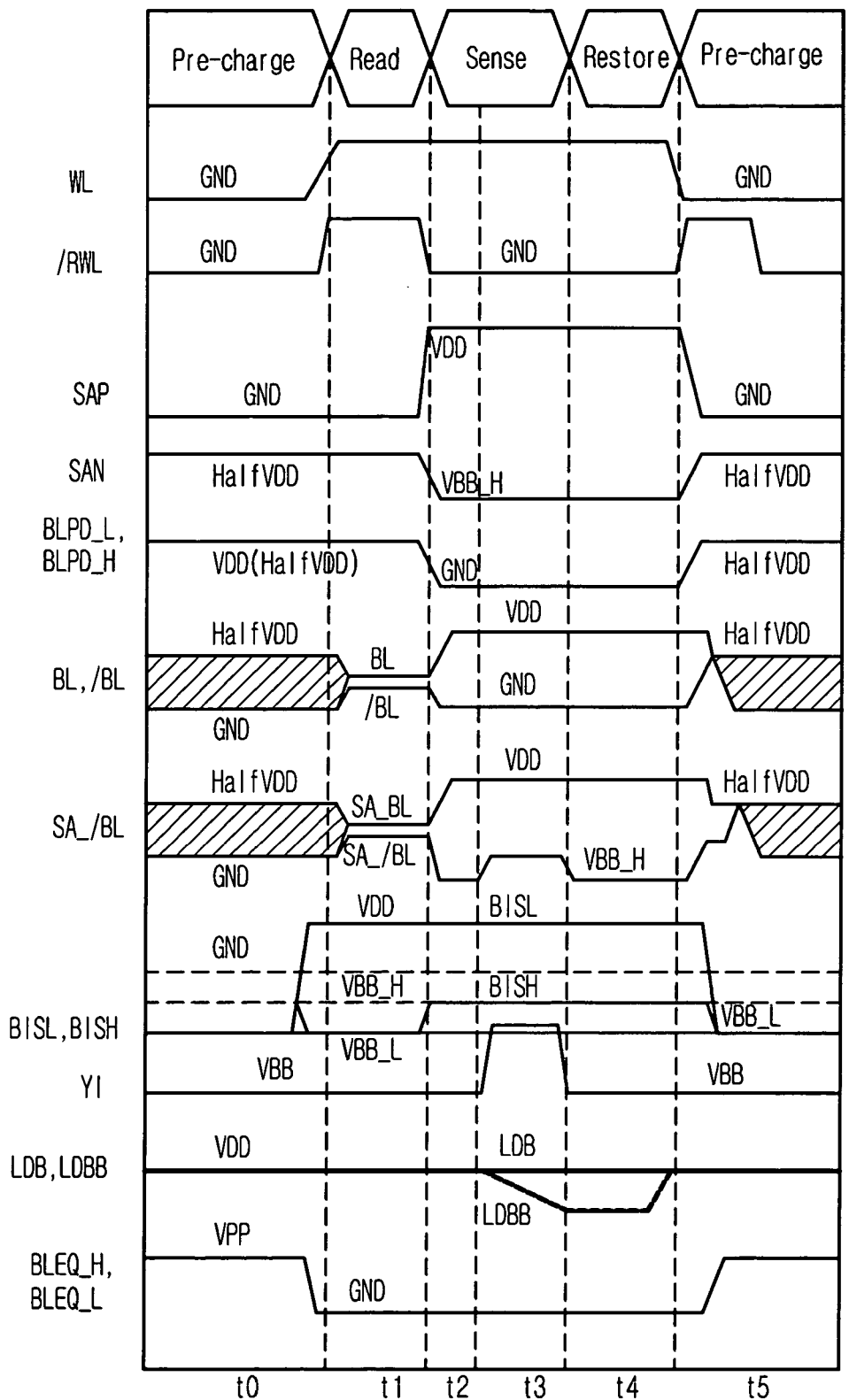
FIGS. 10 and 11 are waveform diagrams depicting the operation of the semiconductor memory device shown in FIGS. 7 to 9.
Figure 11:
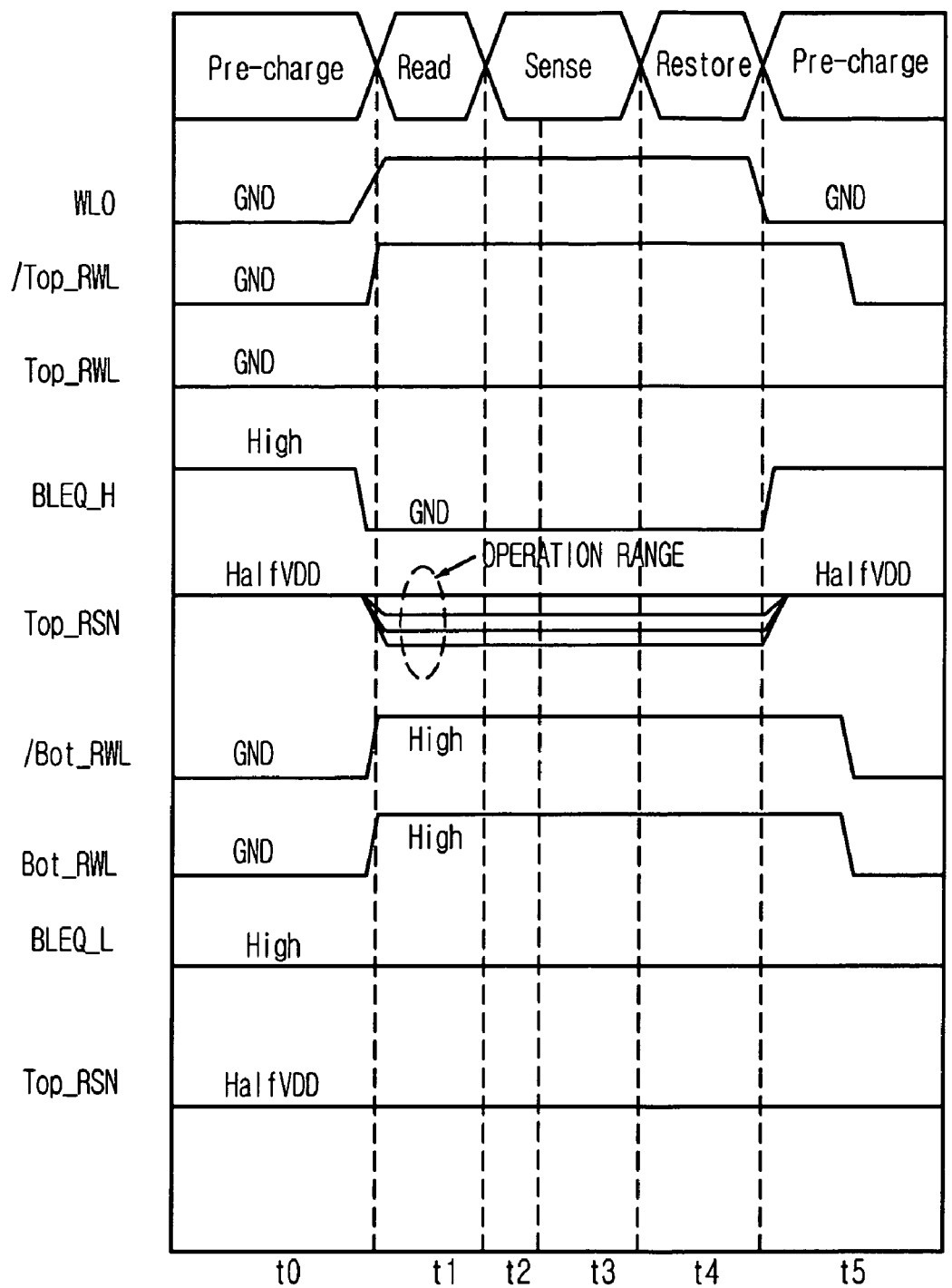

FIGS. 10 and 11 are waveform diagrams showing the operation of the semiconductor memory device shown in FIGS. 7 to 9.

In the semiconductor memory device in accordance with this embodiment, it is characterized that at the pre-charge terminal the bit line BL and the bit line bar /BL are in floating state, without no apply of pre-charge voltage thereto. For this, it includes the reference cell block as mentioned early.

Further, in the semiconductor memory device in accordance with this embodiment, it is characterized that the bit line sense amp does not perform the sensing and amplifying operation by using the ground voltage VSS and the supply voltage VDD but conducts such operation on a difference of voltages applied onto the two bit lines BL and /BL by employing the low voltage VBB lower than the ground voltage VSS and the supply voltage VDD.

In the above, if the level of the supply voltage gradually decreases, there occurs an instance where an absolute value of the low voltage VBB and the supply voltage VDD is same. In such case, the pre-charge voltage level on the bit line is smoothly maintained at the ground voltage VSS level by making the voltage levels on the two bit lines same after the sensing operation by the bit line sense amp.

Further, when the bit line sense amp senses and amplifies signals on the pair of bit lines coupled with its one port, it is operated that the adjacent remaining bit line pairs maintain the pre-charge voltage using the corresponding reference cell block. By ding so, it is possible to prevent variation of voltages on the bit lines, to thereby make a stable sensing of cell data.

Additionally, the semiconductor memory device in accordance with the preferred embodiment of the present invention includes the auxiliary bit line sense amp in the cell array corresponding to the bit line sense amp, wherein when the bit line sense amp is operated to access data, the adjacent bit line pairs are maintained to have a voltage level of VDD/2 using the reference cell block and the pre-charge unit. Hereinafter, there will be described in detail, on how to perform the features of the present invention as mentioned above.

First of all, here will be discussed on an instance of reading data "1". Herein, it is assumed that the data signal is inputted through the bit line BL.

The semiconductor memory device in accordance with the preferred embodiment of the present invention also conducts at intervals of pre-charge, instruction execution of read or write, sense, and restore. First, the operation at the pre-charge interval will be explained below.

At the pre-charge interval (Pre-charge), pre-charge signals BLEQ_H and BLEQ_L is maintained in an enable state, thus making an equalization of the voltage levels on the first bit lines BL and /BL, and the second bit lines Top_BL and Top_/BL, in the first cell array 300a.

As mentioned early, since the semiconductor memory device in accordance with this embodiment does not use an extra voltage at the pre-charge interval, the bit line pairs, BL, /BL, SA_BL, SA_/BL, Bot_BL, /Bot_BL, maintain a floating state (t0). At this time, the connectors 250a and 250b are all in turn on sate and all the word lines maintaining inactivation state input the supply voltage.

Thus, at the pre-charge interval just after reading or writing data, the bit line pairs, BL, /BL, SA_BL, SA_/BL, Bot_BL, /Bot_BL, maintain ½ supply voltage level by the pre-charge units 220a and 220b activated (but, after the sensing and amplifying operation by the bit line sense amp, one line of the bit line pair is maintained at the supply voltage level and the other line is maintained at the ground voltage level). After that, upon an extension of the pre-charge interval, since an extra voltage for pre-charging is not supplied, the voltage level on the bit line maintaining the ½ supply voltage level gradually decreases due to a leakage current after a certain time.

In case that only the pre-charge interval continues without a read or write of data, the voltage on the bit lines BL, /BL, SA_BL, SA_/BL decreases by the ground voltage during the pre-charge interval.

Accordingly, the pre-charge voltage level on the bit lines that are in the floating state may have any varied value between the ½ supply voltage and the ground voltage, according to a length of the pre-charge interval. That is, the pre-charge voltage level on the bit lines under the floating state varies depending on a point of time of the read instruction to be executed during the pre-charge interval.

Next, at the read instruction interval (Read) after the pre-charge interval (Pre-charge), inputted address is decoded and one word line is selected. A second low voltage VBBW is applied onto the selected word line for its activation. MOS transistor in all unit cells corresponding to the activated word line is turned on and data signal stored in the capacitor is applied onto the bit line BL through the MOS transistor turned on.

If the data signal (here, "1") is applied onto the bit line BL, the voltage level on the bit lines BL and SA_BL rises by the data signal applied starting from any level between the ground voltage and the ½ supply voltage that has been changed by a reduction of the voltage level little by little by the floating state until before (t1).

In the meantime, the reference signal is provided to the bit lines /BL and SA_/BL onto which the data signal is not applied.

In the reference cell block 400a, the reference word line /Top_RWL onto which the data signal is not applied is activated; and according to this, the MOS transistor Top_NM2 for reference is turned on and the reference signal stored in the capacitor Top_RC for reference is provided to bit lines /BL and SA_/BL, thus making a rise of voltage levels on the bit lines /BL and SA_/BL by a constant level.

At this time, at a level (i.e., at voltage level on the bit lines BL and SA_BL) that is decreased starting from the ½ supply voltage gradually due to the floating state, the voltage level on the bit lines /BL and SA_/BL also rises by the reference level applied.

As mentioned above, the capacitor Top_RC for reference is formed to have the same capacitance as the capacitor Cap constituting the unit cell, and there is stored ½ of the electric charge amount stored in the unit cell capacitor for the data "1", as the reference signal.

In other words, since reference voltage supply ports Half VDD, Top_RPL, and Bot_RPL of the reference cell block 400a provides VDD/2, there is stored in the capacitor Top_RC for reference signal ½ of the electric charge amount stored in the unit cell capacitor for the data "1" as the reference signal. At this time, the reference voltage supply ports Top_RPL and Bot_RPL supplies a voltage of a same level as a plate voltage PL of the unit cell capacitor in the cell array.

As examples of voltages supplied, there are the supply voltage VDD, VDD/2, and the ground voltage GND. The supply of the voltage of the same level as the plate voltage PL to the reference signal power supply port VCP is to provide a signal of about ½ in proportion to the data signal precisely as the reference signal.

Thus, the voltage level on the bit line /BL carrying the reference signal rises more about ½ than that of the bit line BL conveying the data signal.

For instance, in case the supply voltage of 1.0V increases by about 0.2V by the data signal, at an initial stage of the pre-charge interval the voltage level of the bit lines BL and /BL is maintained at 0.5V. At the following stage, if the data read instruction is conducted when the voltage on the bit line gradually decreases and descends to about 0.3V as the pre-charge interval continues, then the bit line BL onto which the data signal is applied becomes 0.5V (0.3+0.2V) and the voltage level on the bit line bar /BL onto which the reference signal with ½ of the electric charge amount of the data signal is applied becomes 0.4V (0.3+0.1V).

Meanwhile, the pre-charge signal BLEQ_H is activated at the low voltage VBB level and is applied to the pre-charge unit 220a to maintain it at activation state, during the pre-charge interval, while it is inactivated at the supply voltage level and is supplied to the pre-charge unit 220a to maintain it at inactivation state, during the read instruction interval (Read), the sense interval (Sense), and the restore interval (Restore).

Referring now to the sense interval (Sense), supplied to the first sense amp power supply port SAP of the bit line sense amp 210 is the supply voltage VDD and supplied to the second sense amp power supply port SAN is the low voltage VBB.

Thus, the bit line sense amp 210 senses a difference of voltages applied onto the two bit lines BL and /BL; and amplifies and latches a voltage on the bit line BL with relatively large voltage by a supply voltage VPP and a voltage on the first bit line bar /BL by the ground voltage GND VSS (t2).

Since the bit line sense amp 210 conducts the amplification operation using the supply voltage VPP and the low voltage VBB, instead of the supply voltage VDD and the ground voltage GND, it can be operated at more high speed than when doing the amplification operation using the supply voltage VDD and the ground voltage GND merely.

At this time, a voltage on the bit line SA_/BL coupled between the bit line sense amp 210 and the second voltage clamping unit 230b is amplified by the negative low voltage VBB, while a voltage on the bit line /BL from the first cell array 300a to the first voltage clamping unit 230a is amplified by the ground voltage GND by the first connector 250a.

Since the connection control signal BISH inputted to the gates of the PMOS transistors TBH1 and TBH2 constituting the first connector 230a is maintained at low voltage VBB_H level, the bit line /BL connected to the first cell array 300a can be maintained at the ground voltage with higher level than the low voltage VBB although a voltage on the bit line SA_/BL of the bit line sense amp 210 is amplified by the low voltage.

Thus, the second connector 230b performs clamping operation to prevent the low voltage VBB level from transferring towards the bit line /BL of the second cell array 300b although the bit line sense amp 210 amplifies a voltage on the bit line SA_/BL by the negative low voltage VBB.

Further, the parasitic capacitance issued from the bit line /BL coupled with the first cell array 300a is relatively large compared to a sub-threshold voltage current of the PMOS transistors TBH1 and TBH2 forming the first connector 230a; and thus, the bit line /BL connected to the cell array is maintained at the ground voltage level during the sensing and amplifying operation by the bit line sense amp 210 and the restore interval.

By preventing the negative low voltage VBB amplified by the bit line sense amp 210 as such from transferring to the bit lines BL and /BL provided in the cell array, and also by preventing a variation of the voltage on the bit lines by means of maintaining at the ground voltage, the operation speed of the bit line sense amp can be improved and the current consumption due to the variation of voltage on the bit lines arranged in the cell array can also be reduced.

For this, the present invention carries out the function of connecting or separating the adjacent cell arrays 300a and 300b to or from the bit line sense amp by the connectors 230a and 230b consisting of PMOS transistor, together with the clamping function of preventing the low voltage VBB_H of the bit line sense amp 210 from transferring to the bit lines BL, /BL, Top_BL, and /Top_BL prepared in the cell array.

However, this does not let the bit lines BL and /BL provided in the cell array maintain at the ground voltage GND stably; and therefore, in the semiconductor memory device of the present invention, the bit lines BL and /BL connected to the cell array are provided with the auxiliary bit line sense amps 230a and 230b to maintain the ground voltage though a voltage on the bit lines SA_BL and /SA_BL connected to the bit line sense amp 210 is amplified to the negative low voltage VBB_H.

The auxiliary bit line sense amps 230a and 230b sense a difference of voltages on the two bit lines BL and /BL provided in the cell array 300A during the interval where the sensing and amplifying operation by the bit line sense amp 210 is conducted, and amplify or maintain a voltage on the bit line BL with relatively low voltage to the ground voltage.

If the bit line sense amp 210 amplifies a voltage level on the bit line SA_BL to the supply voltage VDD and also a voltage level on the bit line bar SA_/BL to the low voltage VBB, then the bit line BL is maintained at the supply voltage VDD and the bit line bar /BL at the ground voltage GND. And, the auxiliary bit line sense amp 260a descends the voltage level on the bit line /BL to the ground voltage GND if it is higher than the ground voltage GND, and rises it to the voltage GND if it is less than the ground voltage GND.

The signals BLPD_L and BLPD_H are activated at the ground voltage state and applied to the auxiliary bit line sense amps 230a and 230b during the intervals (t2, t3, and t4) where the bit line sense amp 210 is activated.

The two MOS transistors TB1 and TB2 of the auxiliary bit line sense amps 230a and 230b input the ground voltage via their respective input ports, and make a voltage on the bit line with low level out of the two bit lines maintained at the ground voltage GND by their gates coupled with the bit lines BL and /BL in cross couple manner.

Since the unit cell of the cell array is comprised of NMOS transistor and capacitor, in case the bit line sense amp amplifies the voltage level on the pair of the bit lines to the supply voltage level and the low voltage level VBB, the NMOS transistor of unit cell is turned on if the low voltage VBB level reaches a voltage on the bit line arranged in the cell array, resulting in data loss in non-selected unit cells. In this case, during a time when the bit line sense amp is operated, it is necessary to prevent the voltage level amplified to the low voltage by the bit line sense amp from transferring to the bit line arranged in the cell array.

Meanwhile, the connection control signal with two levels is applied to the first and the second connectors 250a and 250b, where one level is the low voltage VBB_L with negative voltage level whose absolute value is larger than that of the threshold voltage of PMOS transistors TBH1, TBH2, TBL1, and TBL2 forming the first and the second connectors 250a and 250b, and the other level is the low voltage VBB_H with negative voltage level whose absolute value is identical to that of the threshold voltage of PMOS transistors TBH1, TBH2, TBL1, and TBL2.

The connection control signals BISH and BISL are inputted as the low voltage VBB_H during the pre-charge interval, maintaining voltage levels on the pair of bit lines BL and /BL provided in the first and the second array cells 300a and 300b identically.

The connection control signal BISL, which is inactivated during the read instruction interval at which the first cell array is connected to the bit line sense amp 210 and the second cell array is separated from the bit line sense amp 210, is applied to the second connector 250b as the supply voltage VDD for its disabling. And, the connection control signal BISH activated during this interval is provided to the first connector 250a as the low voltage VBB_L for its enabling.

Next, during the sense interval Sense) and the restore interval (Restore) at which the bit line sense amp 210 senses and amplifies a voltage on the two bit lines SA_BL and SA_/BL, the connection control signal BISH activated is supplied as the low voltage VBB_H.

Accordingly, it is embodied in such a way that there is certainly made the disconnection between the bit line sense amp and the bit line coupled with the cell array using the low voltage VBB_L with more low level during the operation where the bit line sense amp conducts the sensing and amplifying operation. And, it is implemented in such a manner that there is done the disconnection between the bit line sense amp and the bit line coupled with the cell array using the low voltage VBB_H with more high level than the low voltage VBB_L during the other operations.

The reason to do so is for the bit line sense amp 210 to conduct the sensing and amplifying operation at the maximum high speed during an interval of doing such operation mainly.

Seeing continuously, if the amplifying operation by the bit line sense amp 210 has been completed nearly, I/O control signal YI is activated at high level for a certain time, and in response thereto, the data latched in the bit line sense amp 210 is outputted to the data lines LDB and LDBB (t3). At this time, the data outputted is the one corresponding to the read instruction.

Subsequently, the data latched in the bit line sense amp 210 is restored in the unit cell storing the data signal at the restore interval (Restore) (t4).

If the restore operation has been completed, the word line WL is inactivated at the supply voltage level, and the first and the second sense amp power supply ports SAP and SAN supply the ground voltage and VDD/2 to the bit line sense amp 210, making it disabled.

Since the data lines LDB and LDBB are pre-charged with the supply voltage VDD (or VDD/2) during a time when data is not transferred thereto, in the prior art the voltage on the bit line SA_/BL amplified to the ground voltage by the bit line sense amp rises up to a certain level, in the process of transferring the sensed and amplified data by the bit line sense amp 210.

Thus, it is required that there must be given a sufficient margin of the restore time such that the voltage on the bit line /BL that is risen till the certain level by the bit line sense amp 210 can be come back to the ground voltage. This is to prevent a restore of erroneous data in the unit cell, in the process of the restore operation. In particular, in case the data signal is "0", it may be stored as "1".

To solve the above problem, in the prior art it is needed to extend a length of the restore interval, i.e., t4, compared to before.

However, in the semiconductor memory device in accordance with this embodiment, the voltage on the bit line SA_BL is amplified by the low voltage VBB that is lower than the ground voltage GND by the bit line sense amp 210; and therefore, although there occurs an inflow of current to the bit line /BL that is connected to the bit line sense amp 210 by the data lines LDB and LDBB, there is nearly not a rise of the voltage on the bit line /BL coupled with the bit line sense amp, or it is not larger than the ground voltage GND since such current is offset by the low voltage VBB level on that bit line.

Therefore, the memory device in accordance with the preferred embodiment of the invention can reduce the length of the restore interval t4 compared to before.

Next, if the pre-charge signal BLEQ_H is activated at high level and applied, voltage levels on the two bit lines BL and /BL are identical and in floating state. Further, the connection control signals BISH and BISL are supplied as the low voltage VBB_H, and all the bit lines BL, SA_BL, Bot_BL, /BL, SA_/BL, and /Bot_BL are coupled (t5).

As mentioned above, the voltage on the two bit lines BL and /BL is maintained at ½ supply voltage level at the beginning stage of the pre-charge interval; and in the semiconductor memory device in accordance with this embodiment, the bit lines BL and /BL maintains the floating state since it does not input additional pre-charge voltage, lowering the voltage level thereon gradually with the passage of time.

In the meantime, the second reference cell block 400*b* and the second pre-charge unit 220*b* maintain the activation state during an interval where the first connector 250*a* is activated, making the voltage levels on the second bit line and bit line bar Bot_BL and /Bot_BL maintained at the pre-charge voltage level.

The semiconductor memory device in accordance with this embodiment maintains the floating state without a supply of the additional pre-charge voltage, while allowing the voltage levels on the pair of bit lines to be maintained identically at the pre-charge interval. Thus, it does not need extra pre-charge voltage that all the bit lines maintain during the pre-charge interval.

However, the pre-charge voltage herein designates ½ supply voltage level that maintains when the voltage level on the two bit lines is identical at a state where one bit line is under the supply voltage level and the other bit line is under the ground voltage after performing the read or write operation of the data.

That is to say, it is used to maintain a level on the pair of bit lines, which share the bit line sense amp 210 but are not connected to the same, at the ½ supply voltage level using the corresponding pre-charge unit and reference block during the access of unit cell data in the cell array coupled with the bit line sense amp 210. Shown in FIG. 11 is a detailed operational waveform of the reference cell block on this.

The reason for doing so is to solve any problem that occurs because of an abrupt drop of the bit line voltage of the cell array inactivated due to a difference of voltages at the power input port SAN of the bit line sense amp that is operative to access the bit line voltage level of the cell array inactivated and current data.

Even though the MOS transistors for inputting the connection control signals BISL and BISH are arranged between the power input port SAN of the bit line sense amp and the bit line of the cell array inactivated, sub-current flows as leakage current even when those MOS transistors are turned off, and the voltage level on the bit line of the cell array inactivated abruptly drops due to the leakage current. This phenomenon would more increase when size of the MOS transistors is small.

In general, when the semiconductor memory device is operated, it maintains VDD/2 as the pre-charge voltage. In the shared structure, when the bit line sense amp senses and amplifies a difference of voltages on the pair of bit lines connected to one port of the amp itself, VDD/2 pre-charge voltage that is maintained on the bit line coupled with the other port that is not associated with the data access operation descends due to a voltage difference with the ground voltage supply port, resulting in errors.

Since the semiconductor memory device in accordance with this embodiment makes the voltage level of the bit line that is not associated with the data access operation to maintain in the floating state at the pre-charge interval, the above problem is not occurred and the data access operation can be conducted more efficiently if pre-charge voltage is maintained at VDD/2. This is because it is most effective to maintain the bit line voltage at VDD/2 in sensing the high level data and the low level data.

Further, since the semiconductor memory device in accordance with this embodiment maintains the voltage on the pair of the bit lines that are adjacent to the bit line sense amp accessing the data at VDD/2 using the reference cell block and the pre-charge unit, the bit line that controls the data access operation and all pairs of its adjacent bit lines can be maintained at VDD/2.

Thus, although specific control signal is not issued separately, it is possible to supplement the bit line pre-charge voltage of the memory device.

Up to now, there has been described the operation of reading the data "1" by the semiconductor memory device in accordance with this embodiment. Now, the operation of reading the data "0" will be explained in detail below.

In case that the data to be read is "0", it implies an instance where no electric charge is filled up in the capacitor of the unit cell selected. Thus, the voltage level on the first bit line BL onto which the data signal is applied at the interval t1 where the read instruction is executed after the pre-charge interval is maintained as it is. That is, at this time the voltage level on the first bit line BL is maintained at the ground voltage.

Meanwhile, the reference signal is transferred to the first bit line BL to ascend its level by a certain level. At this time, the ascending voltage level is decided depending on an amount of electric charge corresponding to the reference signal provided onto the first bit line bar /BL, wherein the electric charge amount is stored in the capacitor Top_RC for reference.

Next, the bit line sense amp 210 senses a difference of voltages between the first bit line BL maintaining the ground voltage and the first bit line bar /BL rose by the certain voltage level; and amplifies and latches the voltage on the first bit line BL to the low voltage VBB level and the voltage on the first bit line bar /BL to the supply voltage VDD level.

Herein, the first bit line arranged in the first cell array 300*a* by the first connector 250*a* also maintains the ground voltage.

Details of the remaining intervals are omitted here for the sake of simplicity since they conduct the same operation as the instance of reading the data "1".

Looking the write operation of the semiconductor memory device in accordance with this embodiment continuously, the write operation of writing the data is also performed as the waveforms shown in FIGS. 8 and 9.

At the interval t3 that outputs the data to the external data lines LDB and LDBB, merely data inputted in response to the write instruction is delivered to the bit line sense amp 210 through the data lines LDB and LDBB.

The bit line sense amp 210 replaces the previously latched data with the data delivered and latches the replaced data. The latched data is stored in the corresponding unit cell during the restore interval t4 later. The bit line sense amp 210 also performs the sensing and amplifying operation using the supply voltage VDD and the low voltage VBB, even in case of executing the write instruction.

As described above, the semiconductor memory device in accordance with this embodiment makes the bit lines to be in the floating state at the pre-charge interval, and the bit line sense amp senses and amplifies voltages on the two bit lines BL and /BL employing the supply voltage VDD and the low voltage VBB.

The effects of the semiconductor memory device in accordance with this embodiment are as follows.

Firstly, the present invention allows very little consuming power by maintaining a floating state without a supply of a voltage for the pre-charge to the bit lines during the pre-charge interval. That is, the prior art consumed a certain power since it supplies the ground voltage, ½ supply voltage, or supply voltage during the pre-charge interval. However, the present invention can reduce the consuming power considerably since it does not need additional power upon the pre-charge.

Secondly, the present can prevent a bleed current that occurs due to a short between the word line of unit cell and the bit line. As mentioned early, since there occurs the bleed current continuously though the malfunctioning word line is replaced with spare word line, the unnecessary current is consumed continuously.

However, the semiconductor memory device of this embodiment maintains the floating state without a separate pre-charge voltage for the bit line; and consequently, the bit line voltage becomes the ground voltage level, allowing no bleed current since there is not a difference of voltages between the word line and the bit line.

At this time, there may be incurred some bleed current at the beginning stage of the pre-charge interval, but such bleed current is not occurred continuously and removed when the voltage on the bit line in the floating state becomes the ground voltage.

Thirdly, since the present invention employs the low voltage VBB that is lower than the supply voltage VDD and the ground voltage GND upon the operation of the sense amp, the sense amp can sense and amplify the data signal applied to the bit line at high speed, even in case of the supply voltage of low level.

Furthermore, as the drive voltage of the semiconductor memory device becomes small, an absolute value of the supply voltage VDD may be equal to that of the low voltage VBB. In this case, VDD/2 is used as the ground voltage.

Thus, the bit line sense amp senses the data signal applied to the bit line; and amplifies the data signal of high level to the supply voltage VDD level and the data signal of low level to the low voltage VBB level. After that, the present invention maintains the voltages on the two bit lines identically, letting them maintain the ground voltage VSS naturally.

Fourthly, in the prior art, under the state that there is pre-charged with the supply voltage or ½ supply voltage, the voltage level on the bit line, which is amplified to the low level (or ground level) by the current incoming onto the bit line from the data line, is temporarily increased. However, since the inventive bit line sense amp amplifies the voltage on the bit line to negative low voltage, the current incoming onto the data line is offset by low level (or negative low voltage) and the voltage level on the bit line amplified to the low level does not rise above the ground voltage, thus making the cycle time reduced although it does not prolong the restore interval.

Fifthly, the semiconductor memory device in accordance with this embodiment does not need to consume lots of power, which was rendered to generate the high voltage in the prior art, by making the semiconductor memory device driven using the low voltage, instead of using the high voltage. To generate the low voltage in this embodiment of the invention is because its absolute value is less than that of the high voltage and its characteristic is superior to that of the high voltage.

Sixthly, by maintaining the pair of bit lines that is not connected to the bit line sense amp at VDD/2 pre-charge voltage during the sensing and amplifying operation of the data on the pair of bit lines by the bit line sense amp, this embodiment of the present invention can prevent the flow of the sub-current of the MOS transistors constituting the connectors, thereby decreasing the leakage current upon the data sensing.

Accordingly, the semiconductor memory device in accordance with this embodiment can maintain the data access of high speed while operating at the low voltage.

The present application contains subject matter related to Korean patent application No. 2005-27383, filed in the Korean Patent Office on Mar. 31, 2005, the entire contents of which being incorporated herein by reference.

The present invention is not limited to the embodiments as described above and accompanying drawings, and it will be apparent to those skilled in the art that various modifications, additions and substitutions are possible, without departing from the scope and spirit of the invention as disclosed in the accompanying claims.

What is claimed is:

1. A semiconductor memory device with a folded bit line structure, which is operative by an input of a supply voltage and a ground voltage, comprising:
   a first cell array for applying a data signal onto a first bit line or a first bit line bar;
   a first reference cell block for applying a reference signal onto the first bit line bar when the data signal is inputted onto the first bit line, or the reference signal onto the first bit line when the data signal is inputted onto the first bit line bar;
   a second cell array for applying the data signal onto a second bit line or a second bit line bar;
   a second reference cell block for applying the reference signal onto the second bit line when the data signal is inputted onto the second bit line, or the reference signal onto the second bit line bar when the data signal is inputted onto the second bit line bar; and
   a bit line sense amp for sensing and amplifying a difference of the data signals applied onto one pair of bit lines that are connected to the sense amp, out of a pair of the first bit lines or a pair of the second bit lines,
   wherein each bit line maintains a floating state without an input of a separate pre-charge voltage upon a pre-charge operation, and the other pair of the bit lines that are not connected to the sense amp are pre-charged with the reference signal by the corresponding reference cell block.

2. The semiconductor memory device as recited in claim 1, further comprising:
   a first pre-charge unit for equalizing voltage levels on the first bit line and the first bit line bar arranged in the first cell array upon the pre-charge operation; and
   a second pre-charge unit for equalizing voltage levels on the second bit line and the second bit line bar provided in the second cell array upon the pre-charge operation.

3. The semiconductor memory device as recited in claim 2, further comprising:
   a first connector for connecting or disconnecting the first bit line and the first bit line bar to or from the bit line sense amp, arranged in the first cell array; and
   a first connector for connecting or disconnecting the second bit line and the second bit line bar to or from the bit line sense amp, arranged in the second cell array.

4. The semiconductor memory device as recited in claim 3, wherein the first pre-charge unit includes an NMOS transistor for connecting the first bit line to the first bit line bar at a pre-charge interval.

5. The semiconductor memory device as recited in claim 3, wherein the first reference cell block includes:
  a capacitor for reference signal whose one port is connected to a power supply port for the reference signal;
  a first switch for reference for connecting the other port of the capacitor to the first bit line when the data signal is applied to the first bit line bar; and
  a second switch for reference for coupling the other port of the capacitor with the first bit line bar when the data signal is applied to the first bit line.

6. The semiconductor memory device as recited in claim 5, wherein a capacitance of the capacitor for reference is substantially identical to that of a unit cell capacitor included in the first cell array.

7. The semiconductor memory device as recited in claim 5, wherein the first and the second switches for reference are comprised of NMOS transistors.

8. The semiconductor memory device as recited in claim 6, wherein the voltage level supplied from the power supply port is one of the ground voltage, ½ of the supply voltage, and the supply voltage.

9. The semiconductor memory device as recited in claim 3, wherein the first reference cell block is provided with N capacitors for reference corresponding to N bit line pairs contained in the first cell array.

10. The semiconductor memory device as recited in claim 3, wherein the bit line sense amp performs a sensing and amplifying operation using a first voltage of level that is lower than the ground voltage.

11. The semiconductor memory device as recited in claim 3, wherein the bit line sense amp performs the sensing and amplifying operation on the data signal stored in the unit cell, using the supply voltage and the low voltage maintaining the level less than the ground voltage, said sense amp amplifying the bit line inputting the data signal of high level to the supply voltage level and the bit line receiving the data signal of low level to the low voltage level.

12. The semiconductor memory device as recited in claim 11, wherein an absolute value of the low voltage is equal to that of the supply voltage.

13. The semiconductor memory device as recited in claim 3, wherein the first connector includes:
  a first PMOS transistor for connecting the first bit line to the bit line sense amp in response to a connection control signal; and
  a second PMOS transistor for connecting the first bit line bar to the bit line sense amp in response to the connection control signal.

14. The semiconductor memory device as recited in claim 13, wherein the first and the second PMOS transistors are turned on using a first negative voltage level whose absolute value is larger than threshold voltage of the first and the second PMOS transistors, at an interval where the data signal is applied to the first bit line or the first bit line bar; and are turned on using a second negative voltage level that is equal to an absolute value of threshold voltage of the first and the second PMOS transistors, at other intervals except for said interval.

15. The semiconductor memory device as recited in claim 13, further comprising a first auxiliary bit line sense amp for amplifying and maintaining a line voltage of low level, out of the voltage levels on the first bit line and the first bit line bar between the first cell array and the first connector, to the ground voltage level.

16. The semiconductor memory device as recited in claim 15, wherein the first auxiliary bit line sense amp includes:
  a first NMOS transistor for auxiliary amp whose one port inputs a signal activated at an interval where the bit line sense amp is activated, the other port is connected to the first bit line provided between the first cell array and the first connector, and gate is coupled with the first bit line bar arranged between the first cell array and the first connector; and
  a second NMOS transistor for auxiliary amp whose one port inputs a signal activated at an interval where the bit line sense amp is activated, the other port is connected to the first bit line bar provided between the first cell array and the first connector, and gate is coupled with the first bit line arranged between the first cell array and the first connector.

17. The semiconductor memory device as recited in claim 13, wherein the second connector includes:
  a third PMOS transistor for connecting the second bit line to the bit line sense amp in response to the connection control signal; and
  a fourth PMOS transistor for connecting the second bit line bar to the bit line sense amp in response to the connection control signal.

18. The semiconductor memory device as recited in claim 17, wherein the third and the fourth PMOS transistors are turned on using a first negative voltage level whose absolute value is larger than threshold voltage of the third and the fourth PMOS transistors, at an interval where the data signal is applied to the second bit line or the second bit line bar; and are turned on using a second negative voltage level that is equal to the absolute value of threshold voltage of the third and the fourth PMOS transistors, at other intervals except for said interval.

19. The semiconductor memory device as recited in claim 17, further comprising a second auxiliary bit line sense amp for amplifying and maintaining a line voltage of low level, out of the voltage levels on the second bit line and the second bit line bar between the second cell array and the second connector, to the ground voltage level.

20. The semiconductor memory device as recited in claim 19, wherein the second auxiliary bit line sense amp includes:
  a first NMOS transistor for auxiliary amp whose one port inputs a signal activated at an interval where the bit line sense amp is activated, the other port is connected to the second bit line provided between the second cell array and the second connector, and gate is coupled with the second bit line bar arranged between the second cell array and the second connector; and
  a second NMOS transistor for auxiliary amp whose one port inputs a signal activated at an interval where the bit line sense amp is activated, the other port is connected to the second bit line bar provided between the second cell array and the second connector, and gate is coupled with the second bit line arranged between the second cell array and the second connector.

21. The semiconductor memory device as recited in claim 3, wherein the second pre-charge unit includes an NMOS transistor for connecting the second bit line to the second bit line bar at a pre-charge interval.

22. The semiconductor memory device as recited in claim 3, wherein the bit line sense amp includes:
  a first PMOS transistor for sense amp whose gate is connected to the first bit line bar by the first connector and to the second bit line by the second connector, one port inputs the supply voltage, and the other port is coupled with the first bit line by the first connector and to the second bit line by the second connector;

a second PMOS transistor for sense amp whose gate is connected to the first bit line by the first connector and to the second bit line by the second connector, one port inputs the supply voltage, and the other port is coupled with the first bit line bar by the first connector and to the second bit line bar by the second connector;

a first NMOS transistor for sense amp whose gate is connected to the first bit line bar by the first connector and to the second bit line bar by the second connector, one port inputs the first low voltage, and the other port is coupled with the first bit line by the first connector and to the second bit line by the second connector; and a second NMOS transistor for sense amp whose gate is connected to the first bit line by the first connector and to the second bit line by the second connector, one port inputs the first low voltage, and the other port is coupled with the first bit line bar by the first connector and to the second bit line bar by the second connector.

23. The semiconductor memory device as recited in claim 3, further comprising a data input/output (I/O) unit for transferring the sensed and amplified data by the bit line sense amp to the outside through data lines, and delivering data provided from the outside via the data lines to the bit lines sense amp.

24. The semiconductor memory device as recited in claim 23, wherein the data I/O unit includes:
a first I/O MOS transistor whose gate inputs an I/O control signal, one port is connected to a common other port of the first PMOS transistor and the first NMOS transistor for the bit line sense amp, and the other port is coupled with a first data line; and
a second I/O MOS transistor whose gate inputs the I/O control signal, one port is connected to a common other port of the second PMOS transistor and the second NMOS transistor for the bit line sense amp, and the other port is coupled with a second data line.

25. A driving method for use in a semiconductor memory device having a folded bit line structure, which is operative by an input of a supply voltage and a ground voltage, of sensing and amplifying a difference of voltage levels of signals applied to a first bit line and a first bit line bar that are connected to a first cell array arranged on one side of a bit line sense amp, or to a second bit line and a second bit line bar that are connected to a second cell array provided on the other side of the bit line sense amp, the method comprising the steps of:
connecting the fist bit line and the first bit line bar to the bit line sense amp and disconnecting the second bit line and the second bit line bar from the bit line sense amp;
activating unit cell selected among a plurality of unit cells provided in the first cell array and transferring a data signal stored in the unit cell to the first bit line;
applying a reference signal onto the first bit line bar;
sensing, and amplifying, and latching a difference of data signals on the first bit line and the bit line bar using the ground voltage and a low voltage whose absolute value is lower than the ground voltage by the bit line sense amp; and
maintaining voltage levels on the second bit line and the second bit line bar connected to the second cell array at a pre-charge level, during an interval where the first cell array is connected to the bit line sense amp.

26. The method as recited in claim 25, wherein the bit line sense amp amplifies the first bit line inputting the data signal of high level to the supply voltage level and the first bit line bar to the low voltage level.

27. The method as recited in claim 26, wherein an absolute value of the low voltage is equal to that of the supply voltage.

28. The method as recited in claim 25, further comprising the step of performing, at the sensing, amplifying and latching step, a clamping operation that prevents the low voltage from transferring to the pair of bit lines connected to the unit cell.

29. The method as recited in claim 28, further comprising the step of amplifying a voltage of low level out of two voltage levels on the pair of bit lines arranged in the cell array to the ground voltage.

30. The method as recited in claim 25, further comprising the step of outputting the sensed, amplified and latched data signal as data corresponding to read instruction.

31. The method as recited in claim 25, further comprising the step of replacing and outputting the sensed, amplified and latched data signal with data inputted corresponding to read instruction.

32. The method as recited in claim 30 or 31, further comprising the step of restoring the last sensed, amplified and latched data signal in the unit cell storing the data signal.

33. The method as recited in claim 32, wherein an electric charge amount of the reference signal has a value between two electric charge amounts corresponding to instances where the data signal to the fist bit line is "0" and "1".

34. The method as recited in claim 33, wherein the electric charge amount of the reference signal is ½ of higher value, out of the two electric charge amounts corresponding to the instances where the data signal to the fist bit line is "0" and "1".

35. The method as recited in claim 25, wherein the maintaining step employs a reference signal to be supplied to the second bit line or the second bit line bar.

* * * * *

UNITED STATES PATENT AND TRADEMARK OFFICE
CERTIFICATE OF CORRECTION

| | | |
|---|---|---|
| PATENT NO. | : 7,295,482 B2 | Page 1 of 1 |
| APPLICATION NO. | : 11/185738 | |
| DATED | : November 13, 2007 | |
| INVENTOR(S) | : Hee-Bok Kang et al. | |

It is certified that error appears in the above-identified patent and that said Letters Patent is hereby corrected as shown below:

Claim 25, column 23, line 47, "fist" should read --first--.

Claim 33, column 24, line 42, "fist" should read --first--.

Claim 34, column 24, line 46, "fist" should read --first--.

Signed and Sealed this

Twenty-seventh Day of May, 2008

JON W. DUDAS
*Director of the United States Patent and Trademark Office*